(12) United States Patent
Jiang et al.

(10) Patent No.: US 12,165,838 B2
(45) Date of Patent: Dec. 10, 2024

(54) JOINT ELECTRON-OPTICAL COLUMNS FOR FLOOD-CHARGING AND IMAGE-FORMING IN VOLTAGE CONTRAST WAFER INSPECTIONS

(71) Applicant: KLA Corporation, Milpitas, CA (US)

(72) Inventors: Xinrong Jiang, Palo Alto, CA (US); Christopher Sears, Fremont, CA (US)

(73) Assignee: KLA Corporation, Milpitas, CA (US)

( * ) Notice: Subject to any disclaimer, the term of this patent is extended or adjusted under 35 U.S.C. 154(b) by 280 days.

(21) Appl. No.: 16/697,347

(22) Filed: Nov. 27, 2019

(65) Prior Publication Data

US 2020/0194223 A1 Jun. 18, 2020

Related U.S. Application Data

(60) Provisional application No. 62/780,190, filed on Dec. 14, 2018.

(51) Int. Cl.
*H01J 37/28* (2006.01)
*H01J 37/073* (2006.01)
*H01J 37/22* (2006.01)

(52) U.S. Cl.
CPC ............ *H01J 37/28* (2013.01); *H01J 37/073* (2013.01); *H01J 37/226* (2013.01); *H01J 2237/1405* (2013.01)

(58) Field of Classification Search
None
See application file for complete search history.

(56) References Cited

U.S. PATENT DOCUMENTS 4,263,514 A * 4/1981 Reeds, Jr. ............... H01J 37/09
250/398
6,091,249 A 7/2000 Talbot et al.
(Continued)

FOREIGN PATENT DOCUMENTS

EP 1202320 A2 5/2002
JP 2002524827 A 8/2002
(Continued)

OTHER PUBLICATIONS

International Search Report and Written Opinion mailed Apr. 29, 2020 for PCT/US2019/066116.
(Continued)

*Primary Examiner* — Andrew Smyth
(74) *Attorney, Agent, or Firm* — Suiter Swantz IP

(57) ABSTRACT

A scanning electron microscopy system may include an electron-optical sub-system and a controller. The electron-optical sub-system may include an electron source and an electron-optical column configured to direct an electron beam to a sample. The electron-optical column may include a double-lens assembly, a beam limiting aperture disposed between a first and second lens of the double-lens assembly, and a detector assembly configured to detect electrons scattered from the sample. In embodiments, the controller of the scanning electron microscopy system may be configured to: cause the electron-optical sub-system to form a flooding electron beam and perform flooding scans of the sample with the flooding electron beam; cause the electron-optical sub-system to form an imaging electron beam and perform imaging scans of the sample with the imaging electron beam; receive images acquired by the detector assembly during the imaging scans; and determine characteristics of the sample based on the images.

28 Claims, 16 Drawing Sheets

(56) References Cited

U.S. PATENT DOCUMENTS

| | | | |
|---|---|---|---|
| 6,344,750 B1 | 2/2002 | Lo et al. | |
| 6,445,199 B1 | 9/2002 | Satya et al. | |
| 6,456,019 B1* | 9/2002 | Gordon | B82Y 40/00 |
| | | | 315/389 |
| 6,504,393 B1 | 1/2003 | Lo et al. | |
| 6,566,897 B2 | 5/2003 | Lo et al. | |
| 6,610,980 B2 | 8/2003 | Vencklasen et al. | |
| 6,992,290 B2 | 1/2006 | Watanabe et al. | |
| 7,132,301 B1* | 11/2006 | Fan | H01J 37/28 |
| | | | 250/306 |
| 7,253,410 B1 | 8/2007 | Bertsche et al. | |
| 7,253,645 B2 | 8/2007 | Talbot et al. | |
| 7,453,274 B1* | 11/2008 | Zhong | G01N 23/225 |
| | | | 250/311 |
| 10,096,447 B1* | 10/2018 | Jiang | H01J 37/063 |
| 2002/0145396 A1* | 10/2002 | Gordon | B82Y 10/00 |
| | | | 315/368.15 |
| 2002/0149381 A1* | 10/2002 | Lo | G01R 31/307 |
| | | | 324/754.22 |
| 2002/0166964 A1* | 11/2002 | Talbot | H01J 37/28 |
| | | | 250/307 |
| 2004/0159787 A1* | 8/2004 | Nakasuji | H01J 37/28 |
| | | | 250/311 |
| 2014/0077077 A1* | 3/2014 | Jiang | H01J 37/09 |
| | | | 315/111.81 |
| 2017/0287675 A1 | 10/2017 | Hegde et al. | |
| 2018/0254167 A1 | 9/2018 | Zhao et al. | |
| 2019/0043691 A1* | 2/2019 | Zhang | H01J 37/265 |

FOREIGN PATENT DOCUMENTS

| | | | | |
|---|---|---|---|---|
| JP | 2002353279 A | | 12/2002 | |
| JP | 2009099540 A | | 5/2009 | |
| JP | 2012104836 A | * | 5/2012 | G01R 31/307 |
| TW | 461964 B | | 11/2001 | |
| TW | I462143 B | | 11/2014 | |
| TW | 201801123 A | | 1/2018 | |
| TW | 201841053 A | | 11/2018 | |
| WO | 2018048949 A1 | | 3/2018 | |

OTHER PUBLICATIONS

Taiwan Intellectual Property Office, Office Action dated Apr. 24, 2023, received in Taiwan Application No. 108145754, 40 pages (including translation).

Chinese Patent Office, Office Action received in CN Application No. 201980079961.7, Dec. 20, 2023, 15 pages (including translation).

Japanese Patent Office, Office Action received in JP Patent Application No. 2021533474, Nov. 21, 2023, 11 pages (including translation).

Extended Search Report in European Application No. 19897167.3 dated Aug. 1, 2022, 11 pages.

\* cited by examiner

JOINT ELECTRON-OPTICAL COLUMNS FOR FLOOD-CHARGING AND IMAGE-FORMING IN VOLTAGE CONTRAST WAFER INSPECTIONS

CROSS-REFERENCE TO RELATED APPLICATION

The present application claims the benefit under 35 U.S.C. § 119(e) of U.S. Provisional Application Ser. No. 62/780,190, filed Dec. 14, 2018, entitled JOINT ELECTRON OPTICAL COLUMNS FOR FLOOD CHARGING AND IMAGE FORMING IN VOLTAGE CONTRAST WAFER INSPECTIONS, naming Xinrong Jiang and Christopher Sears as inventors, which is incorporated herein by reference in the entirety.

TECHNICAL FIELD

The present invention generally relates to electron-beam based inspection and review, and, more particularly, to a joint electron-optical column for carrying out flood-charging and image-forming.

BACKGROUND

Automated inspection and review systems are important in process control and yield management for the semiconductor and related microelectronics industries. Such inspection and review systems may include optical and electron-beam based systems configured to identify defects (e.g., unwanted structures or impurities) of the semiconductor devices. Defects may generally be grouped into catastrophic defects (e.g., "killer" defects) and nuisance defects. Catastrophic defects may be defined as defects which affect the operation of integrated circuits on the semiconductor devices, whereas nuisance defects may be defined as defects which have no detrimental effects on the operation of the integrated circuits.

Traditional topographical wafer inspection systems make no distinction between catastrophic defects and nuisance defects. Additionally, topographical wafer inspection systems typically require some form of review to ensure that semiconductor wafers which would otherwise produce acceptable yields of operational integrated circuits are not rejected. Comparatively, voltage contrast wafer inspection systems may exhibit improved performance in identifying and distinguishing catastrophic defects and nuisance defects. However, traditional voltage contrast wafer inspection systems require large, expensive electron-optical systems, and may require re-alignment of electron-optical elements between successive flooding and imaging electron beams. Furthermore, the structural configuration of traditional voltage contrast wafer inspection systems may result in poor image-forming resolution during voltage contrast inspections. Therefore, it would be desirable to provide a system and method which cures one or more of the shortfalls of the previous approaches identified above.

SUMMARY

A scanning electron microscopy system is disclosed. In embodiments, the scanning electron microscopy system includes an electron-optical sub-system and a controller communicatively coupled to the electron-optical sub-system. The electron-optical sub-system may include an electron source configured to generate an electron beam, and an electron-optical column configured to direct the electron beam to a sample. The electron-optical column may include a double-lens assembly including a first lens and a second lens, and a beam limiting aperture disposed between the first lens and the second lens. The electron-optical sub-system may further include a detector assembly configured to detect electrons scattered from a surface of the sample. In embodiments, the controller of the scanning electron microscopy system may be configured to: generate one or more control signals configured to cause the electron-optical sub-system to form a flooding electron beam and perform one or more flooding scans of a portion of the sample with the flooding electron beam; generate one or more control signals configured to cause the electron-optical sub-system to form an imaging electron beam and perform one or more imaging scans of the portion of the sample with the imaging electron beam; receive one or more images acquired by the detector assembly during the one or more imaging scans; and determine one or more characteristics of the sample based on the one or more images.

A scanning electron microscopy system is disclosed. In embodiments, the scanning electron microscopy system includes a controller communicatively coupled to an electron-optical sub-system, the controller including one or more processors configured to execute a set of program instructions stored in a memory, the program instructions configured to cause the one or more processors to: generate one or more control signals configured to cause the electron-optical sub-system to form a flooding electron beam and perform one or more flooding scans of a portion of the sample with the flooding electron beam; generate one or more control signals configured to selectively adjust one or more characteristics of a beam limiting aperture of the electron-optical sub-system in order to switch the electron-optical sub-system from the flooding mode to an imaging mode; generate one or more control signals configured to cause the electron-optical sub-system to form an imaging electron beam and perform one or more imaging scans of a portion of the sample with the imaging electron beam; receive one or more images acquired by a detector assembly of the electron-optical sub-system during the one or more imaging scans; and determine one or more characteristics of the sample based on the one or more images.

A method is disclosed. In embodiments, the method may include: forming a flooding electron beam with an electron-optical sub-system; performing one or more flooding scans of a portion of a sample with the flooding electron beam; adjusting one or more characteristics of a beam limiting aperture of the electron-optical sub-system to switch the electron-optical sub-system from the flooding mode to an imaging mode; forming a flooding electron beam with the electron-optical sub-system; performing one or more imaging scans of a portion of a sample with the imaging electron beam; acquiring one or more images of the portion of the sample during the one or more imaging scans; and determining one or more characteristics of the sample based on the one or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Traditional topographical wafer inspection systems typically make no distinction between catastrophic defects and nuisance defects within a semiconductor device. Additionally, topographical wafer inspection systems typically require some form of review to ensure that semiconductor wafers which would otherwise produce acceptable yields of operational integrated circuits are not rejected. Comparatively, voltage contrast wafer inspection systems may exhibit improved performance in identifying and distinguishing catastrophic defects and nuisance defects. However, traditional voltage contrast wafer inspection systems require large, expensive electron-optical systems, and may require re-alignment of electron-optical elements between successive flooding and imaging scans. Furthermore, the structural configuration of traditional voltage contrast wafer inspection systems may result in poor image-forming resolution during voltage contrast inspections.

Accordingly, embodiments of the present disclosure are directed to a system and method which cure one or more of the shortfalls of previous approaches identified above. Embodiments of the present disclosure are directed to a scanning electron microscopy system which utilizes a joint electron-optical column for flood-charging and image-forming scans. Additional embodiments of the present disclosure are directed to a method for utilizing a joint electron-optical column of a scanning electron microscopy system to perform voltage contrast inspections of a sample. Further embodiments of the present disclosure are directed to scanning procedures for performing voltage contrast inspections with a joint electron-optical column of a scanning electron microscopy system.

It is contemplated herein that embodiments of the present disclosure may significantly reduce the structural components and number of electron-optical elements required for performing successive electron-flooding scans and imaging scans required for voltage contrast inspections. Additionally, embodiments of the present disclosure may improve the resolution of imaging scans carried out during voltage contrast inspections, as well as improve the overall throughput of the voltage contrast inspections.

Referring generally to FIGS. 1-10, a system and method for a scanning electron microscopy system is disclosed, in accordance with one or more embodiments of the present disclosure.

Figure 1:
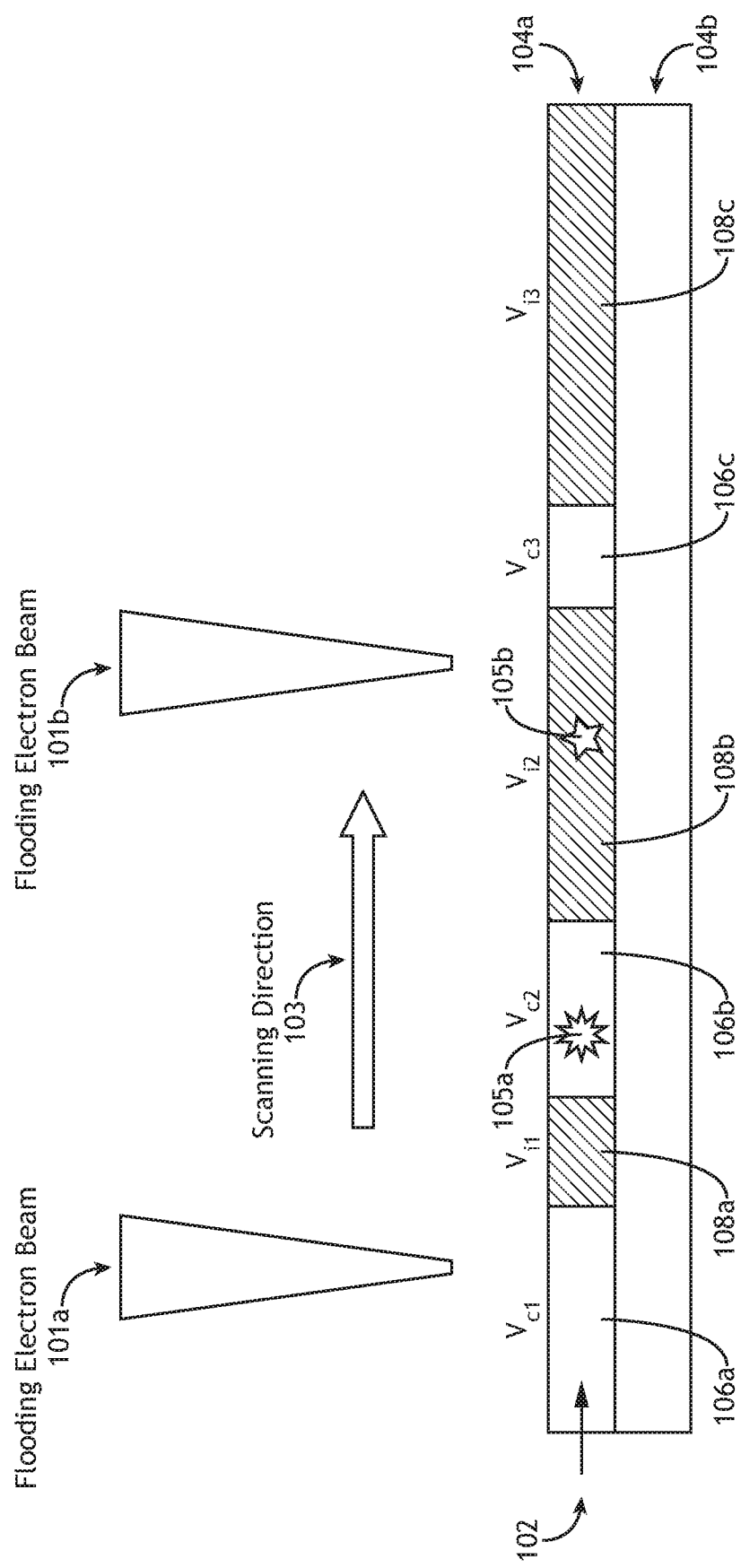
FIG. 1 illustrates a conceptual view of a flooding electron beam being used to generate voltage contrasts within a sample, in accordance with one or more embodiments of the present disclosure.

FIG. 1 illustrates a conceptual view of a flooding electron beam 101 being used to generate voltage contrasts within a sample, in accordance with one or more embodiments of the present disclosure.

In the context of voltage contrast inspections, charged particles may be used to induce voltage contrasts on layers of a sample. For example, as shown in FIG. 1, a sample 102 (e.g., semiconductor wafer) may include a first layer 104a (top layer 104a) and a second layer 104b (bottom layer 104b). The first layer 104a may include a plurality of conductor layer segments 106a, 106b, 106c, and a plurality of insulator layer segments 108a, 108b, 108c. Voltage contrasts may be induced within the sample 102 by directing one or more flooding electron beams 101a, 101b to the surface of the sample 102. The flooding electron beams 101a, 101b may exhibit a large spot size and large electron beam current, and may be scanned across the sample 102 along a scanning direction 103. Additionally and/or alternatively, the sample 102 may be selectively actuated underneath stationary flooding electron beams 101a, 101b such that the flooding electron beams 101a, 101b are incident upon a surface of the sample 102 in a defined pattern.

As the charged particles (electrons) of the flooding electron beams 101a, 101b are incident upon the surface of the sample 102, surface voltages may be induced within the layers (e.g., first layer 104a) of the sample 102. Induced surface voltages may be a function of the local position (x,y) of the sample 102, and may be defined as V(x,y). Furthermore, induced surface voltages (V(x,y)) may be dependent upon a number of factors including, but not limited to, current of the flooding electron beams 101a, 101b, duration of flooding with the flooding electron beams 101a, 101b, thickness of the layers 104a, 104b, and material characteristics of the substances making up the layers (e.g., differences in capacitance, differences in permittivity). For example, as shown in FIG. 1, the plurality of conductor layer segments 106a, 106b, 106c may exhibit surface voltages $V_{c1}$, $V_{c2}$, $V_{c3}$, ... $V_{cj}$, respectively. Comparatively, the plurality of insulator layer segments 108a, 108b, 108c may exhibit surface voltages $V_{i1}$, $V_{i2}$, $V_{i3}$, ... $V_{ij}$, respectively.

After performing one or more flooding scans with the flooding electron beams 101a, 101b, as shown in FIG. 1, one or more imaging scans utilizing imaging electron beams may be performed. Imaging electron beams with a lower current than the flooding electron beams 101a, 101b may be directed to the surface of the sample 102 exhibiting the surface voltages $V_{cj}$, $V_{ij}$, as shown in FIG. 1. Secondary electrons may then be reflected and/or scattered from the surface of the sample 102, and collected by a detector assembly. The current and trajectories of secondary electrons may be based on, at least in part, the surface voltages $V_{cj}$, $V_{ij}$ of the sample 102. The voltage of a structure being imaged determines the brightness of the structure within the acquired images. In this regard, the number of secondary electrons detected for a given position on the sample 102 may indicate the surface voltage of the structure at the given position. Positively biased areas of acquired images may appear darker, whereas negatively biased areas may appear brighter. Accordingly, defects 105a, 105b within the sample 102 may be identified by comparing voltage contrast images of the sample 102 to standard images of the sample 102 without the defect structures.

It is noted herein that structures may be located either on a surface of a layer of a sample (e.g., surface-level structures), or underneath the surface (e.g., sub-surface level structures). Both surface-level structures and sub-surface level structures may be completely characterized by voltage contrasts on the surface of the respective layer. For example, as shown in FIG. 1, the first layer 104a of the sample 102 may include a first defect 105a in the conductor layer segment 106b, and a second defect 105b in the insulator layer segment 108b. Traditional topographical inspection systems may not identify these hidden defects 105a, 105b below the surface of the sample 102. Comparatively, voltage contrast inspection systems may be configured to detect these "invisible" defects below the surface of the sample 102. For example, permittivity differences attributable to the defects 105a, 105b may result in variations to the surface voltages $V_{c2}$, $V_{i2}$, and may therefore be identified by the voltage contrast system.

Defects below a surface of the sample 102 may include, but are not limited to, open vias, incomplete via holes, gate oxide integrity defects, and the like. As "invisible" defects below the surface, traditional topographical inspection systems may not be able to identify and inspect these defects. Furthermore, current voltage contrast inspection systems may exhibit poor image forming resolution when inspecting these defects. Accordingly, embodiments of the present disclosure are directed to a voltage contrast inspection system which exhibits improved throughput and resolution as compared to traditional topographical inspection systems and currently available voltage contrast inspection systems.

Figure 2A:
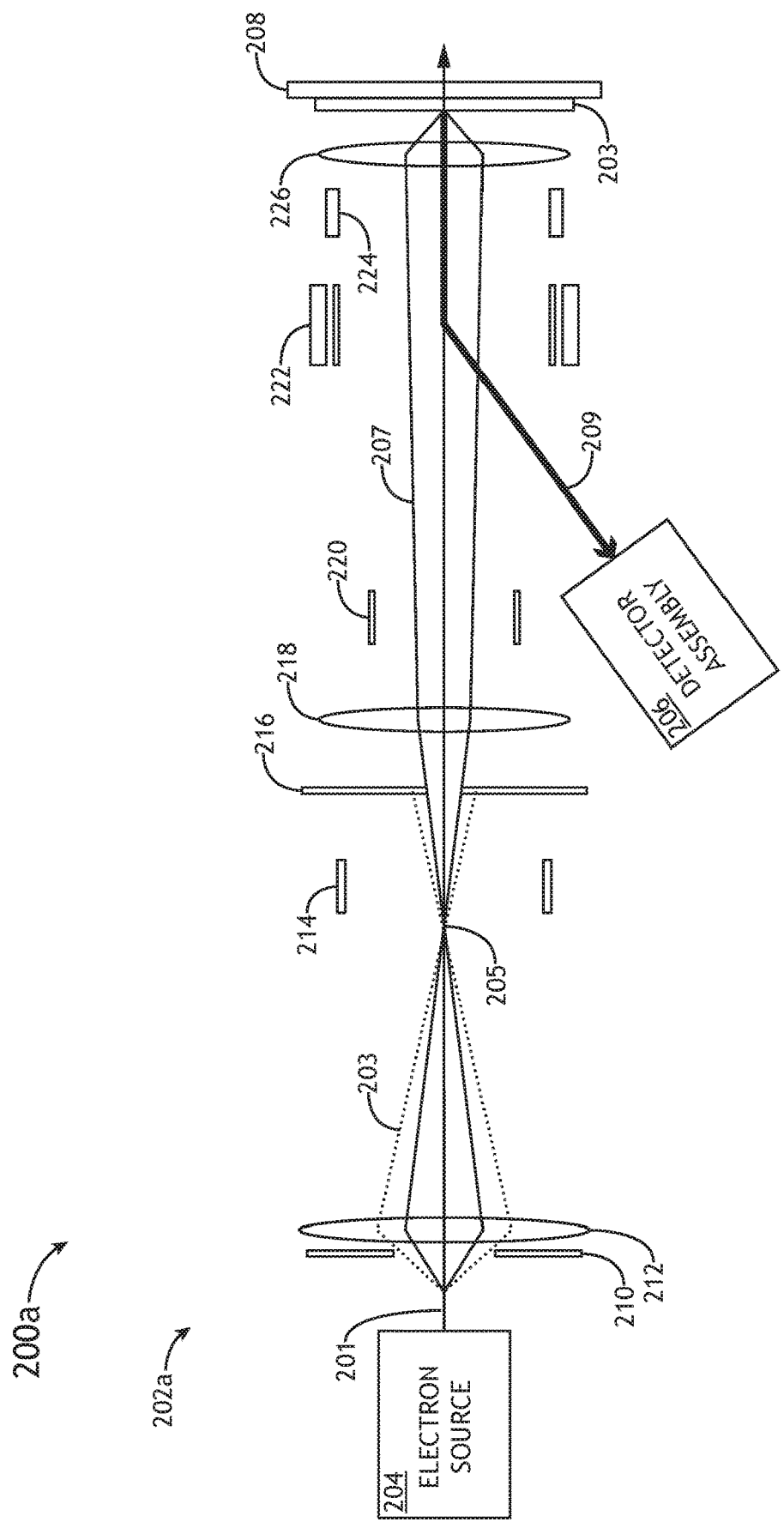
FIG. 2A illustrates a scanning electron microscopy system including an electron-optical column for performing voltage contrast inspections of a sample.

FIG. 2A illustrates a scanning electron-microscopy system 200a including an electron-optical column 202 for performing voltage contrast inspections of a sample 203. In particular, FIG. 2A illustrates an electron-optical column 202 utilized by currently available inspection systems. It is contemplated herein that a brief discussion of the electron-optical column 202 may provide a baseline against which attendant advantages of the present disclosure may be compared.

The electron-optical column 202 may include an electron source 204 configured to generate an electron beam 201 direct an electron beam toward the sample 203. The electron source 204 may include a thermal field emission (TFE) electron source. As will be discussed in further detail herein, the electron beam 201 generated by the electron source 204 may include a flooding electron beam 201 configured to carry out flooding scans, or an imaging electron beam 201 configured to carry out imaging scans.

The electron-optical column 202 may further include a beam-limiting aperture 210, and a gun lens 212 configured to focus the electron beam 201 into an electron beam crossover 205 disposed between the gun lens 212 and a column aperture 216. The beam limiting aperture 210 is configured to receive the electron beam 201 emitted by the electron source 204 and transmit a maximum electron beam 213 exhibiting a maximum electron current which will be directed through the electron-optical column 202. Similarly, the aperture 216 is configured to receive the maximum electron beam 213 and transmit a selected electron beam 207 which will be directed through the electron-optical column 202 to the sample 203.

The electron beam current used for inspection ($BC_i$) (e.g., electron current of the selected electron beam 207) is less than the electron current of the maximum electron beam 213. Additionally, the electron current of the selected electron beam 207 may be adjusted by varying the position of the electron beam crossover 205, or by adjusting the voltage/excitation of the gun lens 212. The electron beam 201 may additionally be turned "on" for inspections or "off" for preparing the inspections (e.g., by moving a stage assembly 208) by controlling a blanker 214.

The electron-optical column 202a may further include a condenser lens 218 and an objective lens 226 configured to receive the selected electron beam 207 and focus/direct the selected electron beam 207 to the sample 203. Numerical apertures of the condenser lens 218 and/or objective lens 226 may be selected to improve image-forming optics of the electron-optical column 202. For example, for a desired electron beam current incident on the sample 203 (e.g., electron beam current of selected electron beam 203), lens aberration blurs and electron-electron interaction blurs may be balanced under the optimal numerical aperture, giving a minimum spot size and/or improved resolution. The optimal numerical aperture may be determined by selecting an optimal focusing strength (e.g., excitation, voltage) of the condenser lens 218.

The electron-optical column 202a may further include pre-scan deflectors 220, main scan deflectors 224, and a Wien filter 222. The pre scan deflectors 220 and main scan deflectors 224 may constitute a dual-deflector assembly, and may be configured to scan the selected electron beam 207 across the sample 203. The dual-deflector assembly may also be configured to minimize off-axis aberration blurs and distortions over a large field of view (FOV). As it relates to throughput, the larger the FOV, the higher throughput for the electron-optical column 202a performing inspections.

A detector assembly 206 of the electron-optical column 202 may be configured to collect secondary electrons 209 emanating from the surface of the sample 203. For example, as the selected electron beam 207 is scanned across the sample 203 via the dual-deflector assembly, secondary electrons 209 emanating from the area under inspection may be deflected by the Wien filter 222, and collected by the detector assembly 206. The detector assembly 206 may then be configured to generate one or more images based on the received secondary electrons 209. Generated images may subsequently be processed in order to identify characteristics of the sample 203.

As noted previously herein, before carrying out a voltage contrast inspection, layers of the sample 203 must first be charged by performing flood- charging scans ("flooding scans"). Accordingly, electron-optical systems configured for performing flood-charging scans of the sample 203 must be used. Current electron-optical systems for performing flood-charging scans may be further shown and described with reference to FIG. 2B.

Figure 2B:
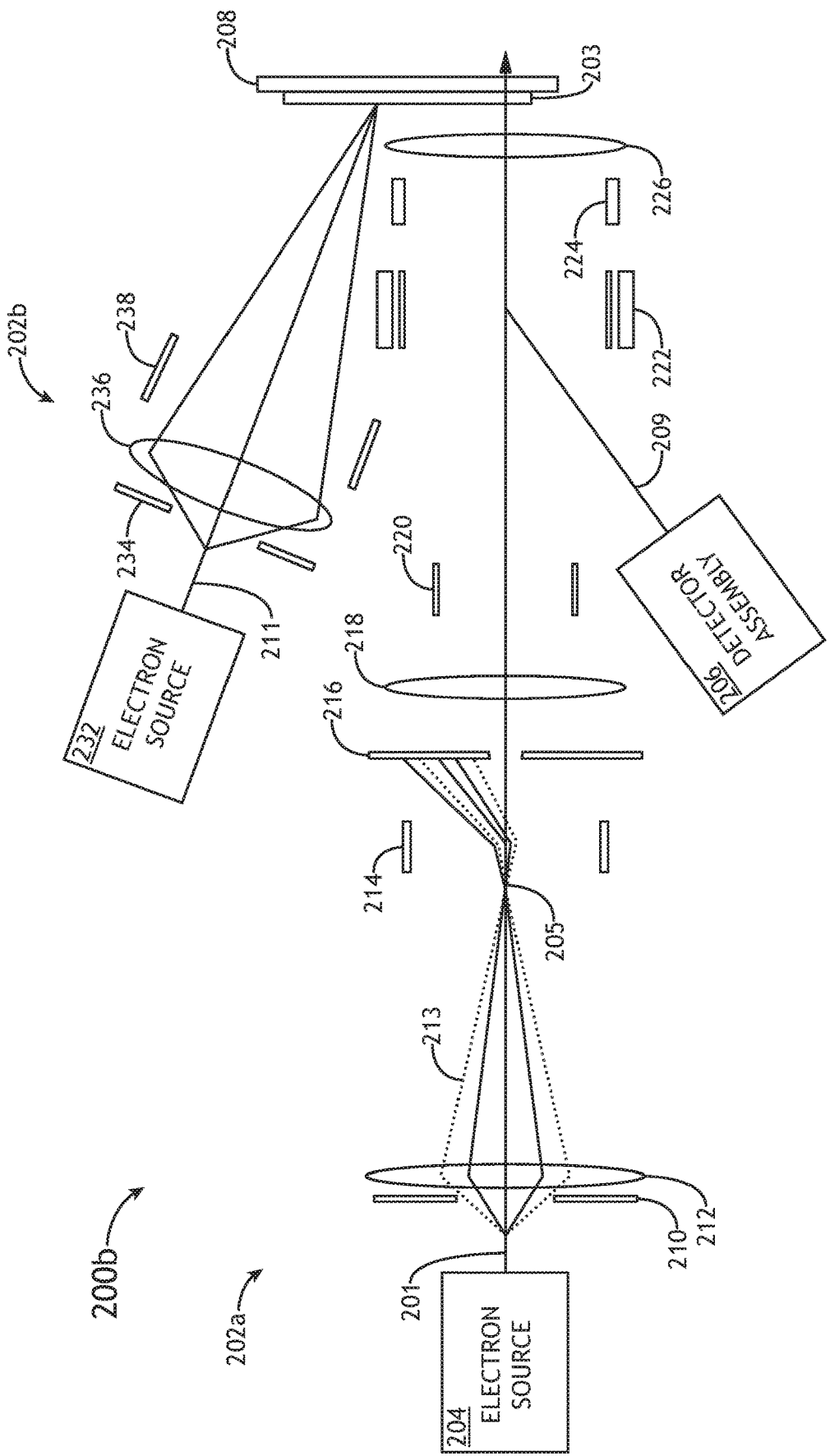
FIG. 2B illustrates a scanning electron-microscopy system including an imaging electron-optical column and a flooding electron optical column for performing voltage contrast inspections of a sample.

FIG. 2B illustrates a scanning electron-microscopy system 200b including an imaging electron-optical column 202a and a flooding electron-optical column 202b for performing voltage contrast inspections of a sample 203. In particular, FIG. 2B illustrates a scanning electron-microscopy system 200b utilized by currently available inspection systems. It is contemplated herein that a brief discussion of the scanning electron-microscopy system 200b may provide a baseline against which attendant advantages of the present disclosure may be compared.

In order to perform the flooding scans and imaging scans required for voltage contrast inspections, the scanning electron-microscopy system 200b may include separate electron-optical columns for each of the respective scans. For example, the scanning electron-microscopy system 200b may include an imaging electron-optical column 202a configured to perform the imaging scans with an imaging electron beam 201. Conversely, the scanning electron-microscopy system 200b may include a separate flooding electron-optical column 202b configured to perform the flooding scans with a flooding electron beam 211. It is noted herein that any discussion associated with the electron-optical column 202a shown in FIG. 2A may be regarded as applying to the imaging electron-optical column 202a shown in FIG. 2B, unless noted otherwise herein.

In order to perform the flooding scans required for voltage contrast inspection with the scanning electron-microscopy system 200b, the blanker 214 may be configured to deflect, or "turn off," the primary imaging electron beam 201 generated by the imaging electron-optical column 202a. For example, as shown in FIG. 2B, the blanker 214 may be configured to deflect the imaging electron beam 201 such that the entirety of the imaging electron beam 201 is blocked/obstructed by the aperture 216.

Subsequently, the stage assembly 208 may be configured to actuate the sample 203 out from the optical axis of the imaging electron-optical column 202a into the optical axis of the flooding electron-optical column 202b. The flooding electron-optical column 202b may then be configured to induce voltage contrasts in the sample 203 by performing one or more flooding scans. For example, an electron source 232 of the electron-optical column 202b may generate a flooding electron beam 211. The electron source 232 may include an adjustable electron source 232 which is configured to selectively adjust flooding electron currents and/or flooding electron landing energies of the flooding electron beam 211 for various flooding scans. The flooding electron beam 211 may be directed through a beam-limiting aperture 234 in order to select the flooding beam current, and a gun lens 236 may focus the flooding electron beam 211 onto the surface of the sample 203. A deflector 238 may be configured to scan the flooding electron beam 211 across the surface of the sample 203 in order to carry out the flooding scans.

In order to charge a large area of the sample 203, the flooding electron beam 211 must exhibit a high electron current. Typically, a flooding electron beam 211 exhibits an electron beam current in approximately the sub-µA to the µA range, wherein the charging landing energy on the surface of the sample 203 is in approximately the sub-keV to keV range. The charging beam spot of the flooding electron beam 201 on the sample 203 may be on the order of tens of microns (µm), hundreds of microns (µm), up to millimeters (mm) in size.

Finally, after performing one or more flooding scans with the flooding electron-optical column 202b in order to induce voltage contrasts within the sample 203, the stage assembly 208 may be configured to actuate the sample 203 back into the optical axis of the imaging electron-optical column 202a. Subsequently, the imaging electron-optical column 202a may be configured to perform one or more imaging scans with the imaging electron beam 201 in order to carry out the voltage contrast inspections.

Due to the fact that the sample 203 must be actuated between the respective flooding and imaging electron-optical columns 202a, 202b, the scanning electron-microscopy system 200b illustrated in FIG. 2B may generally be referred to as a "sample-shift" or "wafer-shift" flood-charging configuration.

While the "wafer-shift" flood-charging configuration of the scanning electron microscopy system 200b illustrated in FIG. 2B may successfully perform voltage contrast inspections, it suffers from several drawbacks. First and foremost, the scanning electron microscopy system 200b requires additional, independent electron-optical elements to carry out the separate flooding and imaging scans. The need for an independent imaging electron-optical column 202a and an independent imaging electron-optical column 202b results in added costs, increased weight, and overall increased complexity. Additionally, the separate electron-optical columns 202a, 202b require a larger vacuum chamber in order to accommodate the additional elements of the scanning electron microscopy system 200b. Secondly, the need to actuate the stage assembly 208 and sample 203 between the optical axis of each respective electron-optical column 202a, 202b requires a large movement range for the sample stage 208, further increasing the required size. Lastly, the scanning electron microscopy system 200b suffers from poor throughput. Actuating the stage assembly 208 long distances between the respective optical axes slows down inspection. Furthermore, the optical elements of each respective electron-optical column 202a, 202b must be re-aligned between each respective imaging/flooding scan, further decreasing throughput.

For at least those reasons identified above, the scanning electron microscopy system 200b illustrated in FIG. 2B may be ill-suited for some voltage contrast inspections. Some of the drawbacks of the scanning electron microscopy system 200b may be alleviated by utilizing some of the optical elements of the imaging electron-optical column 202a for flooding scans. This may be further understood with reference to FIG. 2C.

Figure 2C:
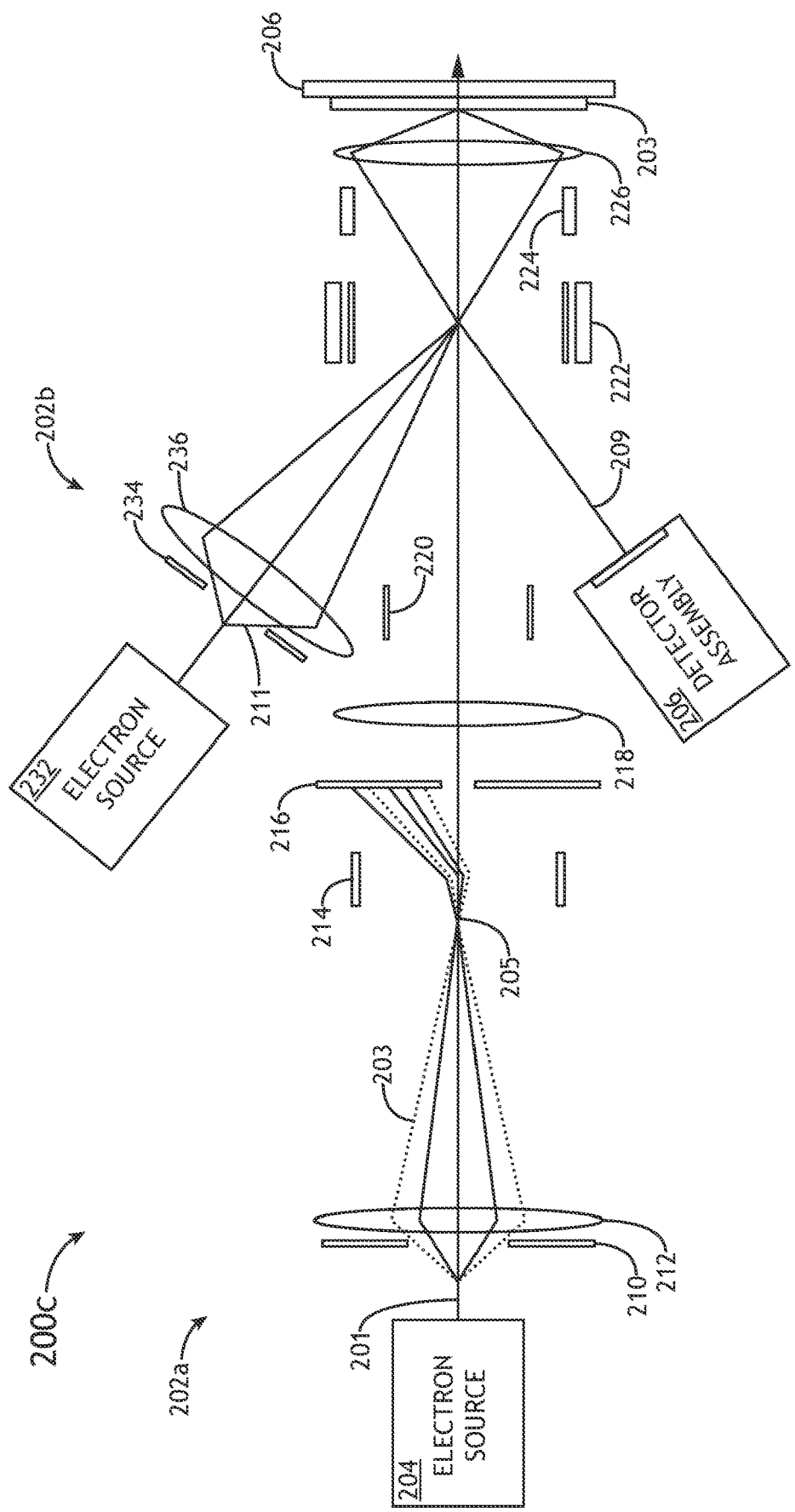
FIG. 2C illustrates a scanning electron-microscopy system including an imaging electron-optical column and a flooding electron optical column for performing voltage contrast inspections of a sample.

FIG. 2C illustrates a scanning electron-microscopy system 200c including an imaging electron-optical column 202a and a flooding electron optical column 202b for performing voltage contrast inspections of a sample 203. In particular, FIG. 2C illustrates a scanning electron-microscopy system 200c utilized by currently available inspection systems. It is contemplated herein that a brief discussion of the scanning electron-microscopy system 200c may provide a baseline against which attendant advantages of the present disclosure may be compared.

It is further noted herein that any discussion associated with the scanning electron microscopy system 200b illustrated in FIG. 2B may be regarded as applying to the scanning electron microscopy system 200c illustrated in FIG. 2C, unless noted otherwise herein.

As shown in FIG. 2C, the scanning electron microscopy system 200c may also include an independent imaging electron-optical column 202a and an independent flooding electron-optical column 202b. However, as compared to the scanning electron microscopy system 200b in FIG. 2B, in which the electron-optical columns 202a, 202b were completely independent, the electron-optical columns 202a, 202b of the scanning electron microscopy system 200c in FIG. 2C may share one or more optical elements. For example, as shown in FIG. 2C, both the imaging electron-optical column 202a and the flooding electron-optical column 202b may both utilize the objective lens 226, Wien filter 222, and main scan deflectors 224.

Compared to FIG. 2B, the flooding electron-optical column 202b illustrated in FIG. 2C may direct the flooding electron beam 211 to the Wien filter 222 and the objective lens 226. The Wien filter 222 may be configured to deflect the flooding electron beam 211 to the objective lens 226, which may then be configured to focus the flooding electron beam 211 onto the surface of the sample 203. The main scan deflectors 224 may then be configured to scan the flooding electron beam 211 over the surface of the sample 203 during a flooding scan. As noted previously, the charging landing energy of the flooding electron beam 211 may be controlled by adjusting the retarding field of the objective lens 226.

As shown in FIG. 2C, the flooding electron beam 211 may exhibit an electron beam crossover proximate to the Wien filter 222. The electron beam crossover may be positioned at any point within the flooding electron-optical column 202b between the gun lens 236 and the objective lens 226. Additionally, adjusting the location of the electron beam crossover within the flooding electron-optical column 202b may adjust the size of the flooding beam spot. It is further noted herein that a flooding electron-optical column 202b without an electron beam crossover may be implemented.

Similar to the drawbacks of the "wafer-shift" flood-charging configuration in FIG. 2B, the "joint-objective lens" flood-charging configuration in FIG. 2C suffers from several drawbacks. In particular, the cost, size, and overall complexity concerns associated with the "wafer-shift" flood-charging configuration in FIG. 2B also apply to the "joint-objective lens" flood-charging configuration in FIG. 2C. Sharing electron-optical elements between the respective electron-optical columns 202a, 202b may also result in several added drawbacks. For example, the strength of the Wien filter 222 may be required to be adjusted for each of the respective flooding scans and imaging scans, and may have to be adjusted between each respective scan. Furthermore, secondary electrons 209 generated by the flooding electron beam 211 during flooding scans are difficult to collect by the detector assembly 206. For example, the strength of the Wien filter 222 for the flooding scans may be optimized to align the flooding electron beam 211 with the objective lens 226, but may result in the secondary electrons 209 to be emitted from the sample 203 with energies which are not optimally directed back to the detector assembly 206, thereby resulting in poor and/or no images to be generated.

In some contexts, the configuration of the scanning electron microscopy system 200a illustrated in FIG. 2A may be utilized to carry out both flooding scans and imaging scans. For example, referring to FIG. 2A, the electron-optical column 202a may be configured to carry out both flooding scans and imaging scans. In this regard, the electron source 204 may be configured to generate a flooding electron beam 201a to be used for flooding scans, and an imaging electron beam 201b to be used for imaging scans. The electron-optical column 202a may be configured to control the charging landing energy of the flooding electron beam 201a by adjusting the retarding field of the objective lens 226, and may be configured to adjust the beam spot size by adjusting the strength of the condenser lens 218 and/or the strength of the objective lens 226. By transitioning between a "flooding mode" and an "imaging mode," the electron-optical column 202a may be configured as a joint-electron optical column to be used for voltage contrast inspection.

However, it is noted herein that using the electron-optical column 202a in FIG. 2A for both flooding scans and imaging scans also comes with several drawbacks. Significantly, flood-charging with the joint electron-optical column 202a may exhibit poor charging performance and/or poor image-forming resolution when carrying out voltage contrast inspection. These disadvantages may be further understood with reference to FIG. 3.

Figure 3:
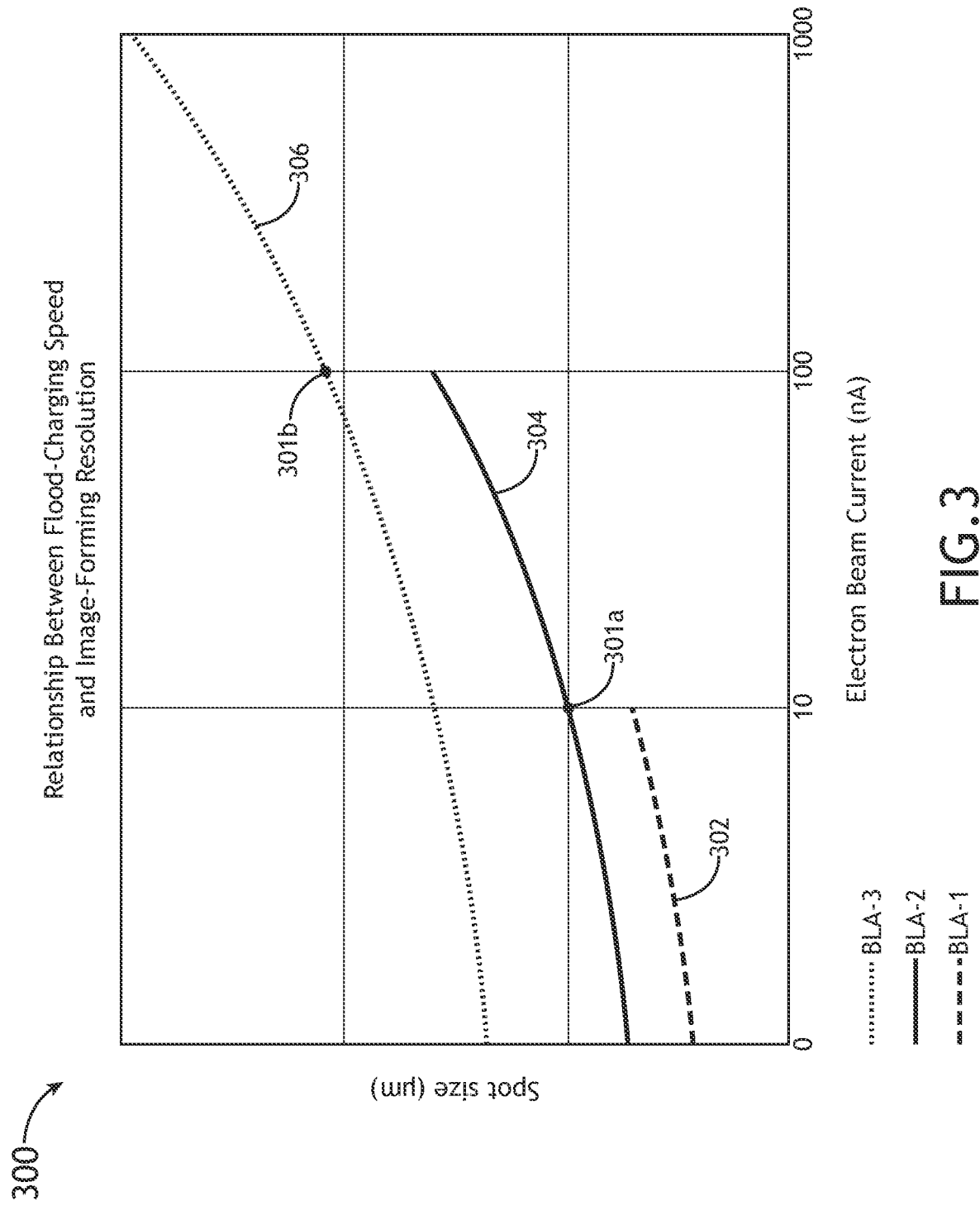
FIG. 3 is a graph illustrating a relationship between image-forming resolution and sample charging speed.

FIG. 3 is a graph 300 illustrating a relationship between image-forming resolution and sample charging speed. More particularly, graph 300 illustrates a relationship between electron beam current of a flooding electron beam 201a generated by the electron-optical column 202a in FIG. 2A, and image-forming resolution of the electron-optical column 202a in FIG. 2A. The electron beam current on the X-axis of graph 300 is directly related to charging speed, with higher electron beam currents resulting in faster charging speeds. Conversely, the spot size on the Y-axis of graph 300 is inversely related to image-forming resolution, with higher spot sizes resulting in lower image-forming resolution.

In order to improve throughputs for an electron beam inspection (EBI) apparatus, such as the scanning electron-microscopy system 200a illustrated in FIG. 2A, the flood-charging time ($T_c$) (e.g., time of a flooding scan) is expected to be significantly shorter than the inspection time ($T_i$) (e.g., time of an imaging scan) over a complete sample 203. For instance, the time for a flooding scan over a sample 203 may be expected to be less than or equal to the imaging time of the sample 203, such that $T_c \leq 0.1*T_i$. In order to meet this limitation, the maximum electron beam current of the flooding electron beam 201a, defined as $I_c$, must be at least ten times greater than the maximum electron beam current of the imaging electron beam 201b, defined as $I_i$ (e.g., $I_c \geq 10*I_i$).

It is noted herein that the electron beam current limitation, $I_c \geq 10*I_i$, must be met in order to achieve sufficient voltage contrast within the sample 203. For example, a sufficient voltage contrast within the sample 102 illustrated in FIG. 1 may include voltage contrasts of 1-10V between the conductor layer segments 106a-106n and the insulator layer segments 108a-108n, such that $1V<|V_{cj}-V_{ij}|<10V$.

For instance, referring to FIG. 2A, assume three maximum electron beam currents of the electron beam 201 are 10 nA, 100 nA, and 1000 nA. The three respective maximum electron beam currents may be defined by varying states of the beam limiting aperture 210, such that a first state of the beam limiting aperture 210 ($BLA_1$) corresponds to the 10 nA electron beam current, a second state of the beam limiting aperture 210 ($BLA_2$) corresponds to the 100 nA electron beam current, a third state of the beam limiting aperture 210 ($BLA_3$) corresponds to the 1000 nA electron beam current (e.g., $BLA_3>BLA_2>BLA_1$).

In this example, as it relates to graph 300 illustrated in FIG. 3, the electron beam 201 generated by $BLA_1$ is represented as curve 302, the electron beam 201 generated by $BLA_2$ is represented as curve 304, and the electron beam 201 generated by $BLA_3$ is represented as curve 306. The curves 302, 304, 306 illustrate that the image-forming resolution of the scanning electron-microscopy system 200a illustrated in FIG. 2A, which is a function of the spot size, is significantly decreased if the imaging electron beam 201b is selected from the flooding electron beam 201a. For instance, if 0-10 nA electron beam currents for the imaging electron beam 201b ($BC_i$) are selected from the 100 nA flooding electron beam currents of curve 304 ($BLA_2$) (e.g., point 301a), the image-forming spot size will sharply increase due to the Coulomb interaction effects between the 90 nA residual electrons in between the beam limiting aperture 210 ($BLA_2$) and the aperture 216. By way of another example, if 0-100 nA electron beam currents for the imaging electron beam 201b ($BC_i$) are selected from the 1000 nA flooding electron beam currents of curve 306 ($BLA_3$) (e.g., point 301b), the image-forming spot size will even more significantly increase due to the Coulomb interaction effects between the 900 nA residual electrons in between the beam limiting aperture 210 ($BLA_3$) and the aperture 216.

For at least those reasons explained above, each of the scanning electron-microscopy systems 200a, 200b, 200c illustrated in FIGS. 2A-2C exhibit their own respective drawbacks which render them ill-suited for some voltage contrast inspection applications.

Accordingly, embodiments of the present disclosure are directed to a scanning electron-microscopy system 400 and related method which cure one or more of the shortfalls of the previous approaches identified above. The scanning electron-microscopy system 400 of the present disclosure may utilize a joint electron-optical column for flood-charging and image-forming, while maintaining image-forming resolution and fast sample charging speeds.

Figure 4A:
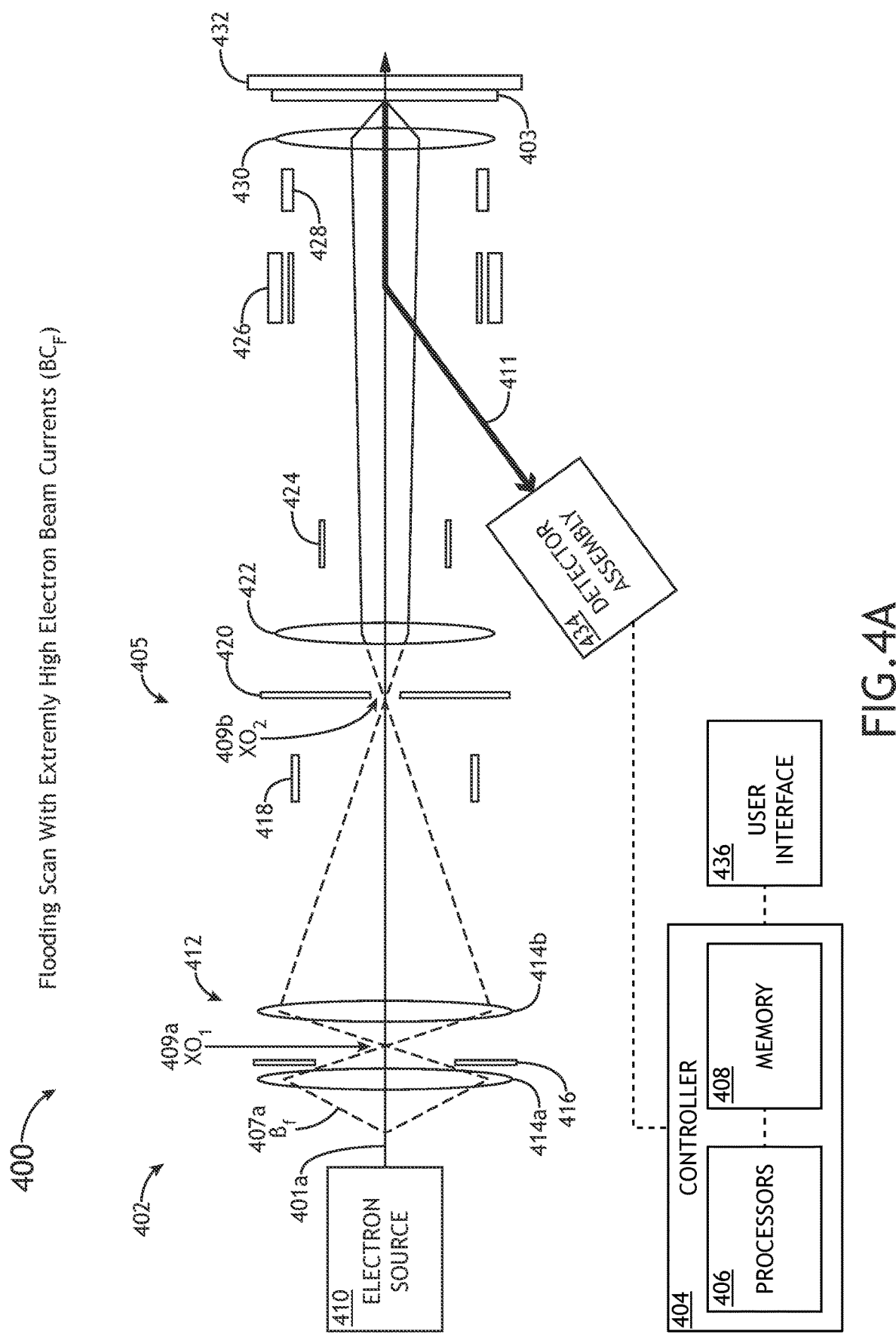
FIG. 4A illustrates a scanning electron microscopy system, in accordance with one or more embodiments of the present disclosure.
Figure 4B:
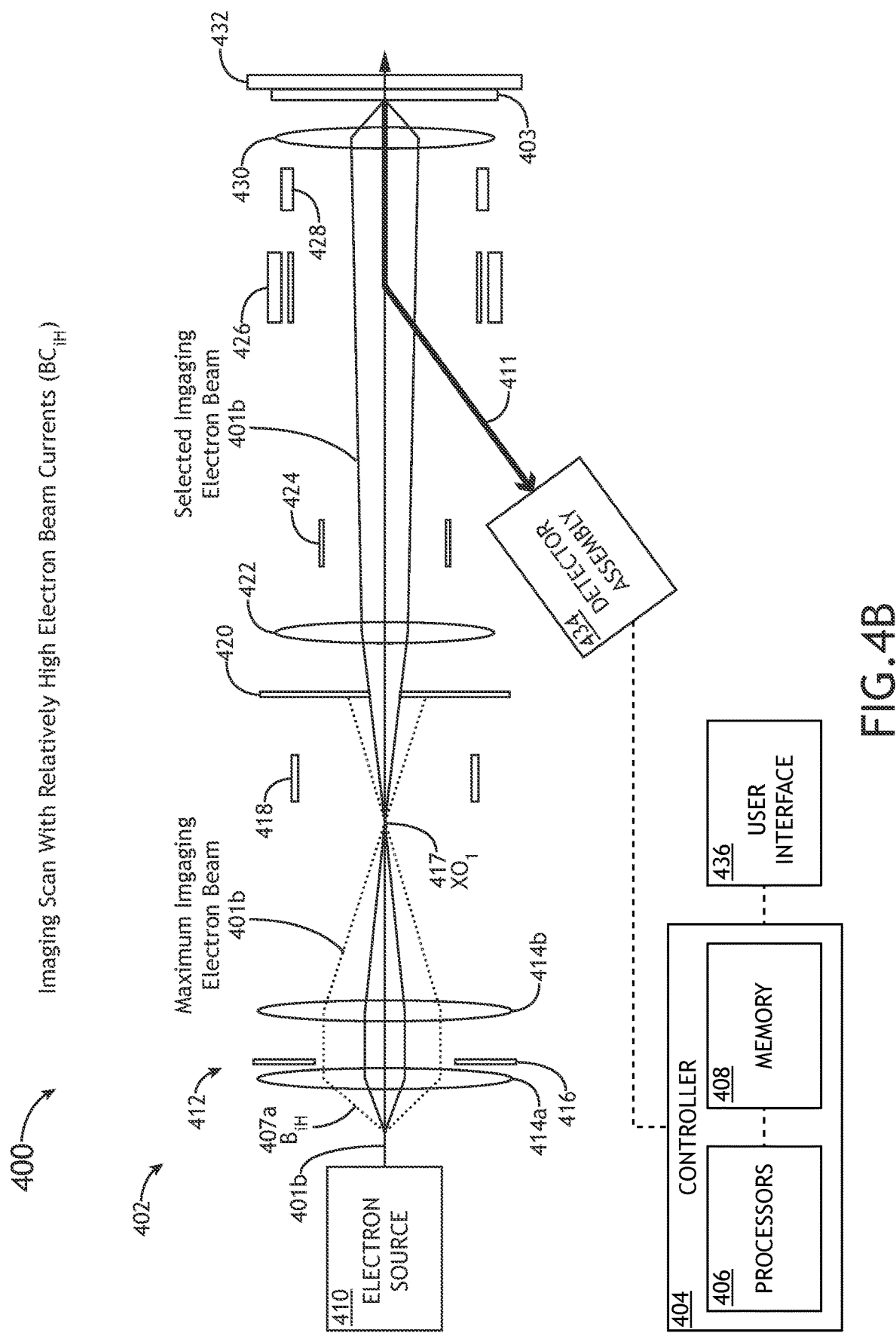
FIG. 4B illustrates a scanning electron microscopy system, in accordance with one or more embodiments of the present disclosure.
Figure 4C:
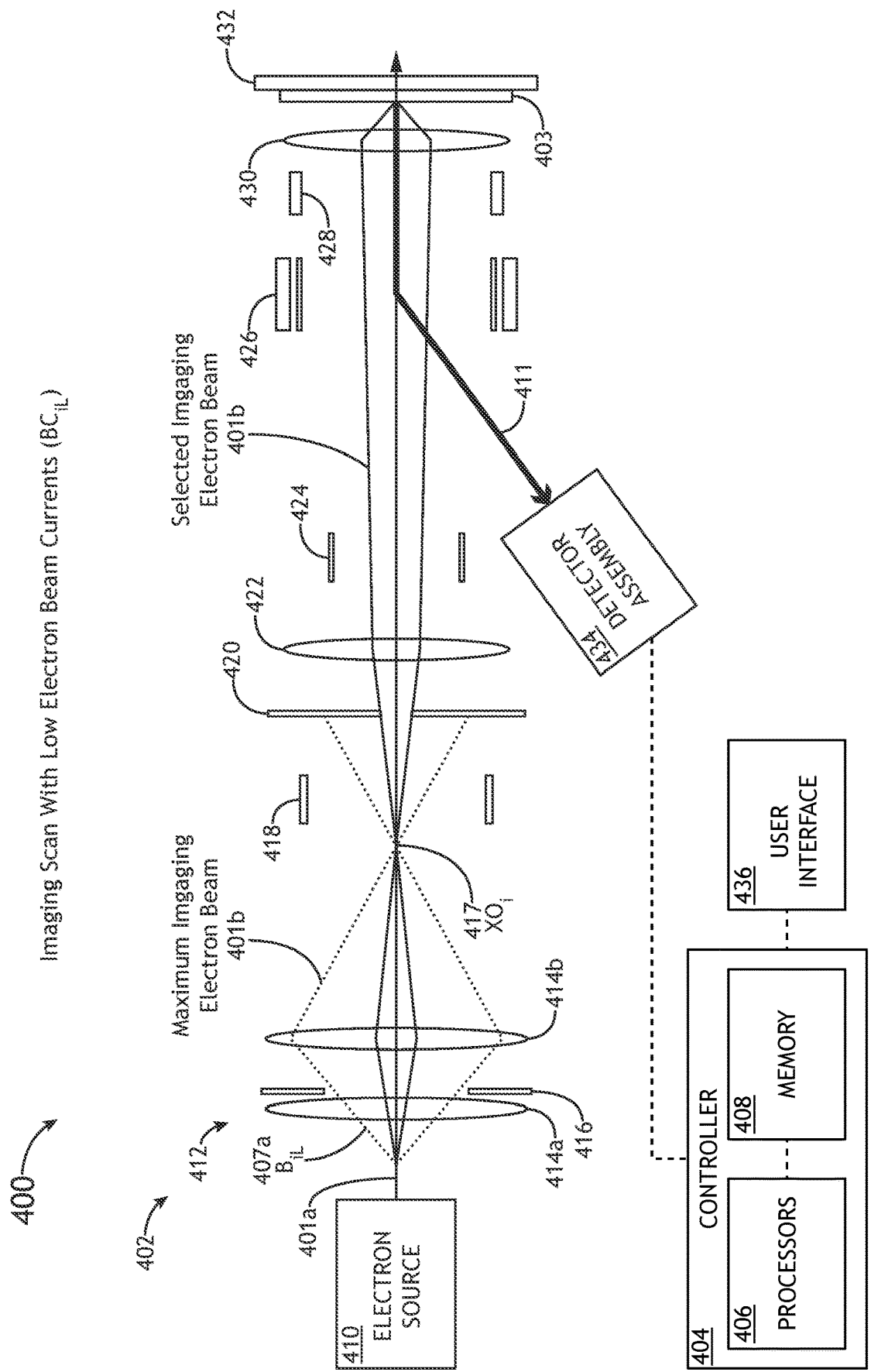
FIG. 4C illustrates a scanning electron microscopy system, in accordance with one or more embodiments of the present disclosure.

FIGS. 4A-4C illustrates a scanning electron microscopy system 400, in accordance with one or more embodiments of the present disclosure. More particularly, FIG. 4A illustrates the scanning electron microscopy system 400 in a "flooding mode" performing a flooding scan using flooding electron beams 401a with extremely high flooding electron beam currents ($BC_f$). Comparatively, FIG. 4B illustrates the scanning electron microscopy system 400 in an "imaging mode" performing an imaging scan using imaging electron beams 401b with relatively high imaging electron beam currents ($BC_{iH}$), and FIG. 4C illustrates the scanning electron microscopy system 400 in an "imaging mode" performing an imaging scan using imaging electron beams 401b with low imaging electron beam currents ($BC_{iL}$). Each of these will be addressed in turn.

Reference will now be made to FIG. 4A. The scanning electron microscopy system 400 may include, but is not limited to, an electron-optical sub-system 402 and a controller 404 communicatively coupled to the electron-optical sub-system 402. In embodiments, the electron-optical sub-system 402 may include, but is not limited to, an electron source 410 configured to generate an electron beam 401, an electron-optical column 405 configured to direct the electron beam 401 to a sample 403, and a detector assembly 434 configured to collect secondary electrons 411 reflected and/or emanated from the sample 403.

In embodiments, the electron source 410 may include any electron source configured to generate an electron beam 301 including, but not limited to, thermal field emission (TFE) electron sources, cold field emission (CFE) electron sources, electron guns, and the like. As will be discussed in further detail herein, the electron beam 401 generated by the electron source 410 may include a flooding electron beam 401a configured to carry out flooding scans (FIG. 4A), or an imaging electron beam 401b configured to carry out imaging scans (FIGS. 4B-4C). In this regard, the electron beam 401a depicted in the "flooding mode" of FIG. 4A may be generally referred to as the flooding electron beam 401a. The electron source 410 may be configured to generate/emit the electron beam 401 from an emission tip of the electron source 410 at an emission angle 407 ($\beta$). The maximum emission angle 407a used for flooding scans ($\beta_f$), as shown in FIG. 4A, may be limited by the beam limiting aperture 416.

The electron beam current for an electron beam 401 may be a function of the emission angle 407 ($\beta$) and the angular intensity ($J_\alpha$) of the electron source 410. Thus, for an electron source 410 with angular intensity ($J_\alpha$), the flooding electron beam current $BC_F$ used for flooding scans may be defined by Equation 1, and the imaging electron beam current $BC_I$ used for imaging scans may be defined by Equation 2:

$$BC_f = \pi\beta_f^2 J_\alpha \quad (1)$$

$$BC_i = \pi\beta_i^2 J_\alpha \quad (2)$$

wherein $BC_f$ defines a flooding electron beam current, $BC_i$ defines an imaging electron beam current, $J_\alpha$ defines the angular intensity of the electron source 410, $\beta_f$ defines the flooding emission angle 407 used for flooding scans (e.g., maximum emission angle 407a illustrated in FIG. 4A), and defines the imaging emission angle 407 used for imaging scans (e.g., emission angles 407b, 407c illustrated in FIGS. 4B-4C). In this regard, the flooding electron beam 401a illustrated in FIG. 4A may be characterized by Equation 1, and the imaging electron beams 401b illustrated in FIG. 4B-4C may be characterized by Equation 2.

The electron-optical column 405 may include one or more electron-optical elements configured to receive the electron beam 401 (e.g., flooding electron beam 401a) from the electron source 410 and direct the electron beam 401 to the sample 403. In embodiments, the electron-optical column 405 may include a double lens assembly 412 (e.g., double-focusing lens assembly) including a first lens 414a (e.g., first gun lens 414a) and a second lens 414b (e.g., second gun lens 414b). The electron-optical column 405 may further include a beam limiting aperture 416. For example, as shown in FIG. 4A, the electron-optical column 405 may further include a beam limiting aperture 416 disposed between the first lens 414a and the second lens 414b of the double-lens assembly 412. The beam limiting aperture 416 may be configured to receive the electron beam 401 transmit/define a maximum electron beam current of the electron beam 401 which will be directed through the electron-optical column 405.

In embodiments, the first lens 414a of the double-lens assembly 412 is configured to focus the electron beam 401 to a first electron beam crossover 409a ($XO_1$). For example, the first lens 414a may be configured to focus the electron beam 401 to a first electron beam crossover 409a ($XO_1$) proximate to the beam limiting aperture 416 between the first and second lenses 414a, 414b of the double-lens assembly 412. By forming the first electron beam crossover 409a ($XO_1$) proximate to the beam limiting aperture 416, as shown in FIG. 4A, the first lens 414a may enable extremely high electron beam currents (e.g., sub-µA to µA) required for flooding scans through the electron-optical column 405.

Subsequently, the second lens 414b of the double-lens assembly 412 is configured to focus and direct the electron beam 401 to a second electron beam crossover 409b ($XO_2$). For example, the second lens 414b may be configured to focus the electron beam 401 to a second electron beam crossover 409b ($XO_2$) proximate to an aperture 420. In some embodiments, the second electron beam crossover 409b ($XO_2$) may be formed proximate to the aperture 420 such that the electron beam 401 passed through the aperture maintains a high electron beam current required for flooding scans.

The electron source 410 and the double-lens assembly 412 may be further shown and described with reference to FIGS. 5A-5B.

Figure 5A:
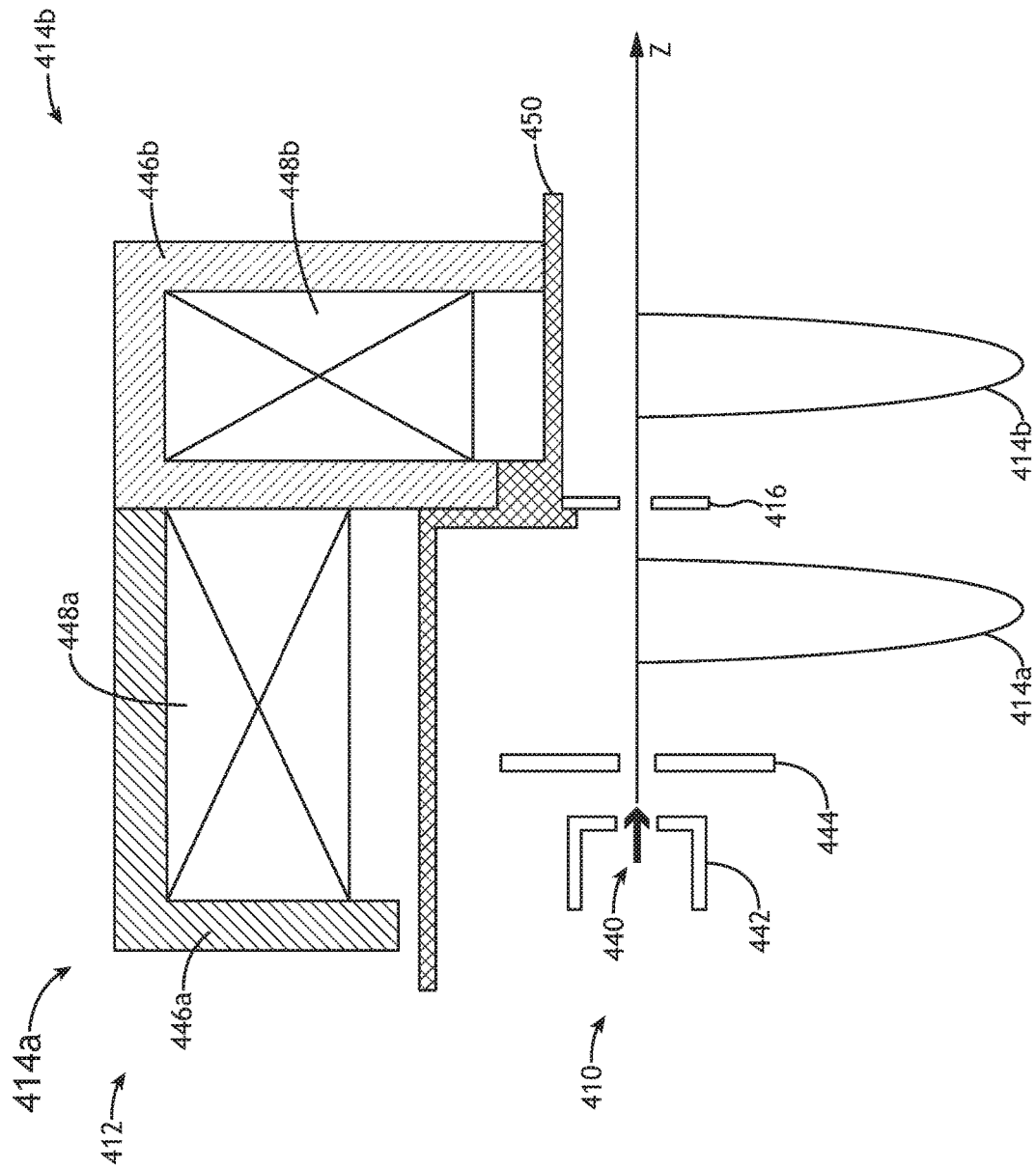
FIG. 5A illustrates a cross-sectional view of a double-lens assembly of a scanning electron microscopy system, in accordance with one or more embodiments of the present disclosure.

FIG. 5A illustrates a cross-sectional view of a double-lens assembly 412 of a scanning electron microscopy system 200, in accordance with one or more embodiments of the present disclosure. Specifically, the upper half of FIG. 5A illustrates a portion of a detailed cross-sectional view of the double-lens assembly 412, and the lower half of FIG. 5A illustrates the corresponding simplified cross-sectional view of the double-lens assembly 412. It is noted herein that the double-lens assembly 412 may be rotationally symmetric in practice, thus the depiction in FIG. 5A is provided merely for illustrative purposes.

In embodiments, as shown in FIG. 5A, the electron source 410 may include, but is not limited to, a tip 440, a suppressor 442, and an extractor 444. For example, the electron source 410 illustrated in FIG. 5A may include a TFE electron source or a CFE electron source. The first and second lenses 414a, 414b of the double-lens assembly 412 may include magnetic gun lenses 414a, 414b. For example, the first lens 414a may include a first pole piece 446a and a first coil 448a, and the second lens 414b may include a second pole piece 446b and a second coil 448b. In embodiments, the pole pieces 446a, 446b and the coils 448a, 448b of the magnetic gun lenses 414a, 414b are sealed in air by a vacuum sealing tube 450 in order to protect against contamination. The beam limiting aperture 416 may be disposed between the lenses 414a, 414b.

In embodiments, the size and position of the beam limiting aperture 416 may be selectively adjusted and/or optimized for meeting image-forming resolution requirements and/or flood-charging speed requirements for a specified inspection throughput. It is noted herein that a distance between the extractor 444 and the anode (or the beam limiting aperture 416 in ground) may be selectively adjusted/optimized in order to meet electron beam energy variation requirements for various inspection applications.

Figure 5B:
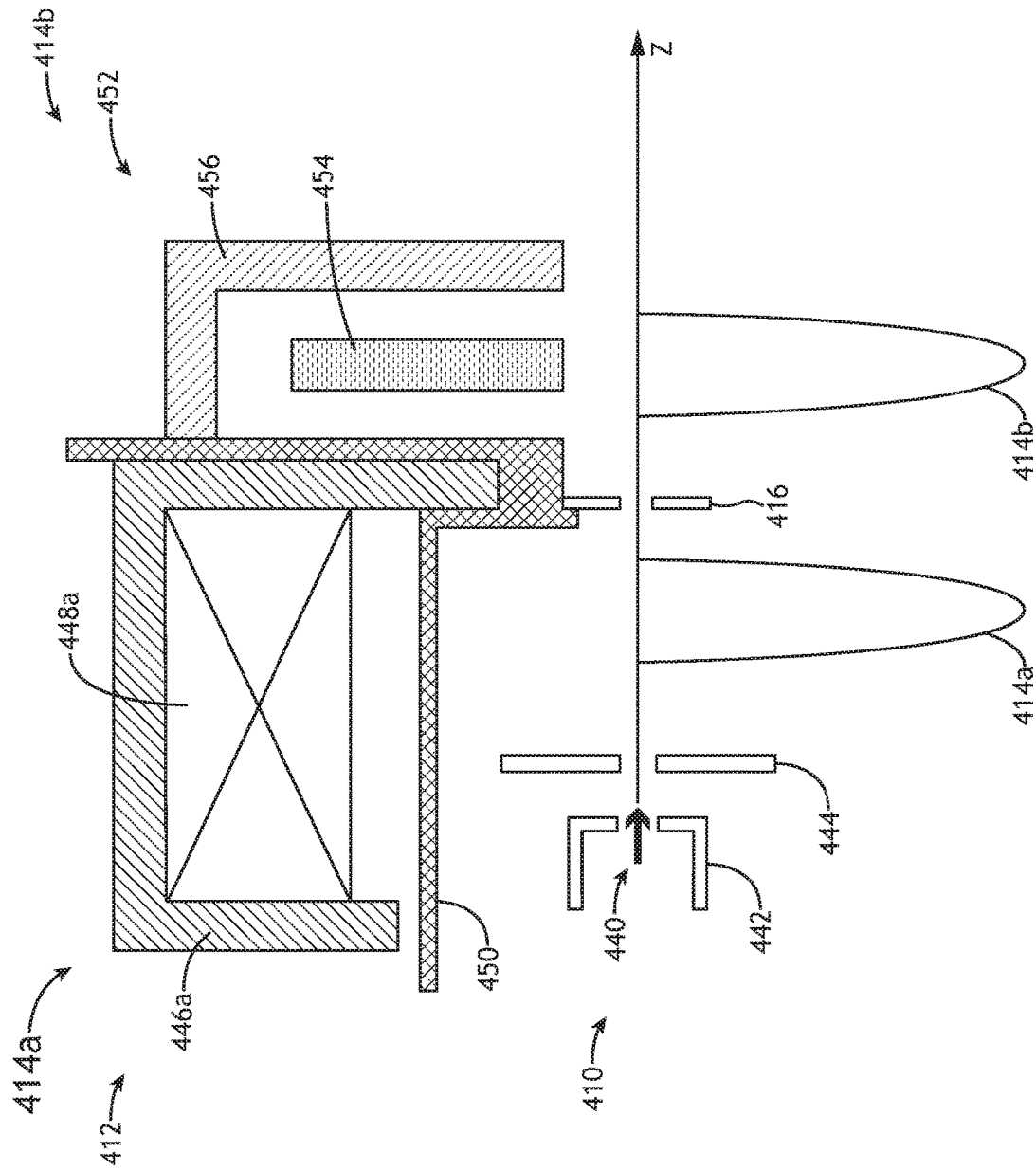
FIG. 5B illustrates a cross-sectional view of a double-lens assembly of a scanning electron microscopy system, in accordance with one or more embodiments of the present disclosure.

FIG. 5B illustrates a cross-sectional view of a double-lens assembly 412 of a scanning electron microscopy system 200, in accordance with one or more embodiments of the present disclosure. The double-lens assembly 212 illustrated in FIG. 5B is provided as an additional and/or alternative example to that pictured in FIG. 5A. Accordingly, the examples of the double-lens assembly 212 are provided solely for illustrative purposes, and should not be regarded as limiting, unless noted otherwise herein.

As noted previously herein with respect to FIG. 5A, the upper half of FIG. 5B illustrates a portion of a detailed cross-sectional view of the double-lens assembly 412, and the lower half of FIG. 5B illustrates the corresponding simplified cross-sectional view of the double-lens assembly 412. It is noted herein that the double-lens assembly 412 may be rotationally symmetric in practice, thus the depiction in FIG. 5B is provided merely for illustrative purposes.

In additional and/or alternative embodiments, one or more lenses 414a, 414b of the double-lens assembly 412 may include an electrostatic lens 452. For example, as shown in FIG. 5B, the second lens 414b of the double-lens assembly 412 may include an electrostatic lens 452. For instance, the electrostatic lens 452 may include an Einzel lens and/or uni-potential lens including a focusing electrode 454 disposed between one or more ground electrodes 456. In additional and/or alternative embodiments, the electrostatic lens 452 may include an acceleration lens or a deceleration lens.

It is noted herein that the use of one or more electrostatic lenses 452 may provide for fast switching/adjusting of electron beam currents when performing voltage contrast inspections. In this regard, the use of one or more electrostatic lenses 452 may provide for faster and more efficient switching of the electron beam currents required for flooding scans (flooding mode depicted in FIG. 4A) and imaging scans (imaging mode depicted in FIGS. 4B-4C).

Reference will again be made to FIG. 4A. In embodiments, the electron-optical column 405 may include one or more additional electron-optical elements configured to direct the electron beam 401 to the sample 403. For example, the electron-optical column 405 may include a blanker 418 which may be turned "on" for inspections (e.g., flooding scans, imaging scans) or "off." By way of another example, the electron-optical column 405 may further include, but is not limited to, a condenser lens 422, pre-scan deflectors 424, a Wien filter 426, main scan deflectors 428, and an objective lens 430. Numerical apertures of the condenser lens 422 and/or objective lens 430 may be selected to improve image-forming optics of the electron-optical column 405. The condenser lens 422 and/or objective lens 430 may include any electron-optical lens known in the art including, but not limited to, an electrostatic lens. The pre scan deflectors 424 and main scan deflectors 428 may constitute a dual-deflector assembly, and may be configured to scan the selected electron beam 401 across the sample 403. In additional and/or alternative embodiments, the stage assembly 432 may be selectively actuated in order to scan the electron beam 401 across the sample 403. The dual-deflector assembly may also be configured to minimize off-axis aberration blurs and distortions over a large field of view (FOV).

In embodiments, the electron-optical sub-system 402 may further include a detector assembly 434 configured to detect electrons 411 (e.g., secondary electrons 411) reflected, scattered, or otherwise emanated from the surface of the sample 403 in response to the electron beam 401. In embodiments, the Wien filter 426 may be configured to re-direct electrons 411 scattered from the sample 403 to the detector assembly 434. The detector assembly 434 may be configured to generate/acquire one or more images of the sample 403 based on the received electrons 411.

In embodiments, the scanning electron microscopy system 400 may further include a controller 404 communicatively coupled to the detector assembly 434. The controller 404 may include one or more processors 406 configured to execute a set of program instructions stored in memory 408, the set of program instructions configured to cause the one or more processors 406 to carry out the various steps/functions of the present disclosure. For example, the one or more processors 406 may be configured to: generate one or more control signals configured to cause the electron-optical sub-system 402 to form a flooding electron beam 401a and perform one or more flooding scans of a portion of the sample 203 with the flooding electron beam 401a; generate one or more control signals configured to cause the electron-optical sub-system 402 to form an imaging electron beam 401b and perform one or more imaging scans of the portion of the sample 403 with the imaging electron beam 401b; receive one or more images acquired by the detector assembly 434 during the one or more imaging scans; and determine one or more characteristics of the sample 403 based on the one or more images. Each of these steps/functions will be addressed in turn.

In one embodiment, the controller 404 may be configured to generate one or more control signals configured to cause the electron-optical sub-system 402 to form a flooding electron beam 401a and perform one or more flooding scans of a portion of the sample 403 with the flooding electron beam 401a.

Upon generating the flooding electron beam 401a to carry out one or more flooding scans, the flooding electron beam 401a may be scanned across the surface of the sample 403 via the pre-scan deflectors 424 and/or main scan deflectors 428. Due to the fact that there typically is not a resolution requirement for flooding scans, the controller 404 may be configured to scan the flooding electron beam 401a across the sample 403 with only one and/or both of the pre-scan deflectors 424 and main scan deflectors 428. In additional and/or alternative embodiments, the controller 404 may be configured to carry out the one or more flooding scans by scanning the flooding electron beam 401a by selectively actuating the stage assembly 432 upon which the sample 403 is disposed. It is further noted herein that the one or more flooding scans may be performed on the sample 403 in order to induce a voltage contrast within one or more layers of the sample 403.

The Wien filter 426 may be configured to collect electrons 411 emanating from the surface of the sample 403, and direct the electrons 411 to the detector assembly 434. The detector assembly 434 may or may not be configured to collect secondary electrons 411 during the one or more flooding scans. In embodiments where the detector assembly 434 is configured to receive secondary electrons 411 and generate images during the flooding scans, the controller 404 may be configured to store the generated images in memory 408 and/or discard the generated images.

In another embodiment, the controller 404 may be configured to generate one or more control signals configured to cause the electron-optical sub-system 402 to form an imaging electron beam 401b and perform one or more imaging scans of the portion of the sample 403 with the imaging electron beam 401b. This may be further understood with reference to FIGS. 4B-4C.

FIGS. 4B-4C illustrate a scanning electron microscopy system 400, in accordance with one or more embodiments of the present disclosure. More specifically, FIGS. 4B-4C each illustrate the scanning electron microscopy system 400 in an "imaging mode," wherein FIG. 4B illustrates the scanning electron microscopy system 400 performing an imaging scan using imaging electron beams 401b with relatively high electron beam currents, and FIG. 4C illustrates the scanning electron microscopy system 400 performing an imaging scan using imaging electron beams 401b with low electron beam currents.

It is noted herein that any discussion associated with the scanning electron microscopy system 400 illustrated in FIG. 4A may be regarded as applying to the scanning electron microscopy system 400 illustrated in FIGS. 4B-4C, to the extent applicable, and unless noted otherwise herein. Conversely, any discussion associated with the scanning electron microscopy system 400 illustrated in FIGS. 4B-4C may be regarded as applying to the scanning electron microscopy system 400 illustrated in FIG. 4A, to the extent applicable, and unless noted otherwise herein.

Reference will now be made specifically to FIG. 4B. FIG. 4B illustrates the scanning electron microscopy system 400 performing an imaging scan using imaging electron beams 401b with relatively high beam currents. In embodiments, the first lens 414a may be set with some level of excitation higher than that shown in FIG. 4C. The first lens 414a may be configured to focus the imaging electron beam 401b and select a relatively high raw/maximum electron beam current ($BC_{iH}$) through the beam limiting aperture 416, as illustrated by the maximum imaging electron beam. The imaging electron beam 401b resulting from the high electron beam current ($BC_{iH}$) may be characterized by imaging emission angle 407b ($\beta_{iH}$).

The maximum imaging electron beam may be further reduced/divided by directing and/or focusing the imaging electron beam 401b, with the second lens 414b, to an electron beam crossover 417 ($XO_1$) between the second lens 414b and the aperture 420. In this regard, the aperture 420 may be selectively adjusted in order to control one or more characteristics of the selected imaging electron beam 401b. For example, the aperture 420 may be selectively adjusted in order to control the imaging electron beam current ($BC_{iH}$). In other words, the aperture 420 may be configured to identify a selected imaging electron beam from the maximum imaging electron beam.

Comparatively, FIG. 4C illustrates the scanning electron microscopy system 400 performing an imaging scan using imaging electron beams 401b with low electron beam currents. Referring specifically to FIG. 4C, the first lens 414a may be set "off," or may be set with relatively low excitations in order to keep it active and/or stable. With no and/or minimal focusing being performed by the first lens 414a, only the paraxial-region emission electrons of the imaging electron beam 401b generated by the electron source 410 pass through the beam limiting aperture 416. Accordingly, the imaging emission angle 407b ($\beta_{iL}$) illustrated in FIG. 4C may be much smaller than the flooding emission angle 407a ($\beta_f$) illustrated in FIG. 4A (e.g., $\beta_{iL} < \beta_f$). Furthermore, as compared to FIG. 4B, the imaging emission angle 407b ($\beta_{iL}$) illustrated in FIG. 4C may be smaller than the imaging emission angle 407b ($\beta_{iH}$) illustrated in FIG. 4B (e.g., $\beta_{iL} < \beta_{iH}$).

It may be appreciated that selectively modifying the beam limiting aperture 416 and/or aperture 420 may effectively transition the scanning electron microscopy system 400 between the flooding mode illustrated in FIG. 4A and the imaging mode illustrated in FIGS. 4B-4C. Flooding scans may require extremely high electron beam currents ($BC_f$), whereas imaging scans may be performed across relatively low, moderate, or relatively high electron beam currents ($BC_{iH}$, $BC_{iL}$).

In this regard, the controller 404 may be configured to selectively modify one or more characteristics of the beam limiting aperture 416 and/or aperture 420 in order to define the flooding electron beam current (BC$_f$) (FIG. 4A), imaging electron beam currents (BC$_{iH}$, BC$_{iL}$) (FIGS. 4B-4C), flooding emission angle (β$_f$) (FIG. 4A), and/or imaging emission angles (β$_{iH}$, β$_{iL}$) (FIGS. 4B-4C). In particular, the controller 404 may be configured to switch the electron-optical subsystem 402 between the flooding mode and the imaging mode by selectively adjusting one or more characteristics of the beam limiting aperture 416. For example, the controller 404 may be configured to adjust a size of the beam limiting aperture 416 and/or a position of the beam limiting aperture 416 within the double-lens assembly 412 (e.g., distance from first lens 414a, distance from second lens 414b).

The relationship between electron beam currents and emission angles for the various flooding modes and imaging modes may be described by Equation 3:

$$\beta_f^2 : \beta_{iH}^2 : \beta_{iL}^2 = BC_f : BC_{iH} : BC_{iL} \quad (3)$$

wherein β$_f$ and BC$_f$ define the flooding emission angles and flooding electron beam currents used in the flooding mode depicted in FIG. 4A, β$_{iH}$ and BC$_{iH}$ define the imaging emission angles and imaging electron beam currents used in the imaging mode with relatively high electron beam currents depicted in FIG. 4B, and β$_{iL}$ and BC$_{iL}$ define the imaging emission angles and imaging electron beam currents used in the imaging mode with low electron beam currents depicted in FIG. 4C.

Upon generating the imaging electron beam 401b to carry out one or more imaging scans, the imaging electron beam 401b may be scanned across the surface of the sample 403 via the pre-scan deflectors 424 and/or main scan deflectors 428. As opposed to flooding scans, which typically do not have a resolution requirement, the controller 404 may be configured to scan the imaging electron beam 401b across the sample 403 with both of the pre-scan deflectors 424 and main scan deflectors 428 in order to meet image-forming resolution requirements. In this regard, for imaging scans with higher image-forming resolution requirements over a particular field of view (FOV), the controller 404 may scan the imaging electron beam 401b with both the pre-scan deflectors 424 and main scan deflectors 428 in order to minimize deflection aberrations and distortion by optimizing the relative strength and rotation ratios of the pre-scan deflectors 424 and main scan deflectors 428. In additional and/or alternative embodiments, the controller 404 may be configured to carry out the one or more imaging scans by scanning the imaging electron beam 401b by selectively actuating the stage assembly 432 upon which the sample 403 is disposed.

In some embodiments, the controller 404 may be configured to selectively bias the sample 403 when performing the flooding scans and/or imaging scans in order to retard the flooding electron beam 401a and/or imaging electron beam 401b. It is contemplated herein that biasing the sample 403 may allow the controller 404 to more finely adjust a landing energy (LE) of the flooding electron beam 401a and/or imaging electron beam 401b for an optimal voltage contrast, or an optimal inspection condition for a specific layer of the sample 403.

Subsequently, the Wien filter 426 may be configured to collect electrons 411 emanating from the surface of the sample 403, and direct the electrons 411 to the detector assembly 434. In some embodiments, the Wien filter 426 strength used throughout the flooding scans and imaging scans may be equivalent, or substantially equivalent. Constant Wien filter 426 strengths for flooding scans and imaging scans may be possible due to the fact that the electron beam 401 energy is not changed when switching between a flooding mode (flooding scans) and an imaging mode (imaging scans).

Accordingly, the detector assembly 434 may be configured to collect the electrons 411 under the same Wien filter 426 strength for both the flooding mode and imaging mode. In this regard, the controller 404 may be configured to operate the Wien filter 426 at a constant strength while carrying out the flooding scans in the flooding mode and while carrying out the imaging scans in the imaging mode. When performing the one or more imaging scans of the sample 403, as shown in FIG. 4B-4C, the detector assembly 434 may be configured to collect secondary electrons 411 emanating from the surface of the sample 403. The detector assembly 432 may be further configured to generate one or more images of the sample 403 based on the collected/received secondary electrons 411. In another embodiment, the controller 404 may receive the one or more images acquired by the detector assembly 434 during the one or more imaging scans. The controller 404 may be configured to store the received images in memory 408.

Importantly, the spot size of the flooding electron beam 401a may be relatively large (tens of microns to hundreds of microns). As a result, the electrons 411 may be widely distributed on the detectors assembly 434 during the flooding scans. Accordingly, the detector assembly 434 may not be at risk for damage from overly-energized electrons 411, even during a flooding mode utilizing extremely high flooding electron beam currents.

In another embodiment, the controller 404 may be configured to determine one or more characteristics of the sample 403 based on the one or more images. Characteristics of the sample 403 which may be identified may include, but are not limited to, the presence of defects (e.g., catastrophic defects, nuisance defects), defect position, defect size, measurements of the sample 403, and the like. In additional and/or alternative embodiments, the controller 404 may be configured to generate one or more control signals configured to selectively adjust one or more characteristics of one or more process tools based on the one or more determined characteristics of the sample 403. In this regard, the controller 404 may be configured to generate one or more control signals in a feed-forward or feed-back loop in order to selectively adjust upstream and/or downstream process tools. Process tools which may be adjusted based on determined characteristics of the sample 403 may include, but are not limited to, lithography tools, etching tools, polishing tools, deposition tools, and the like.

Figure 6:
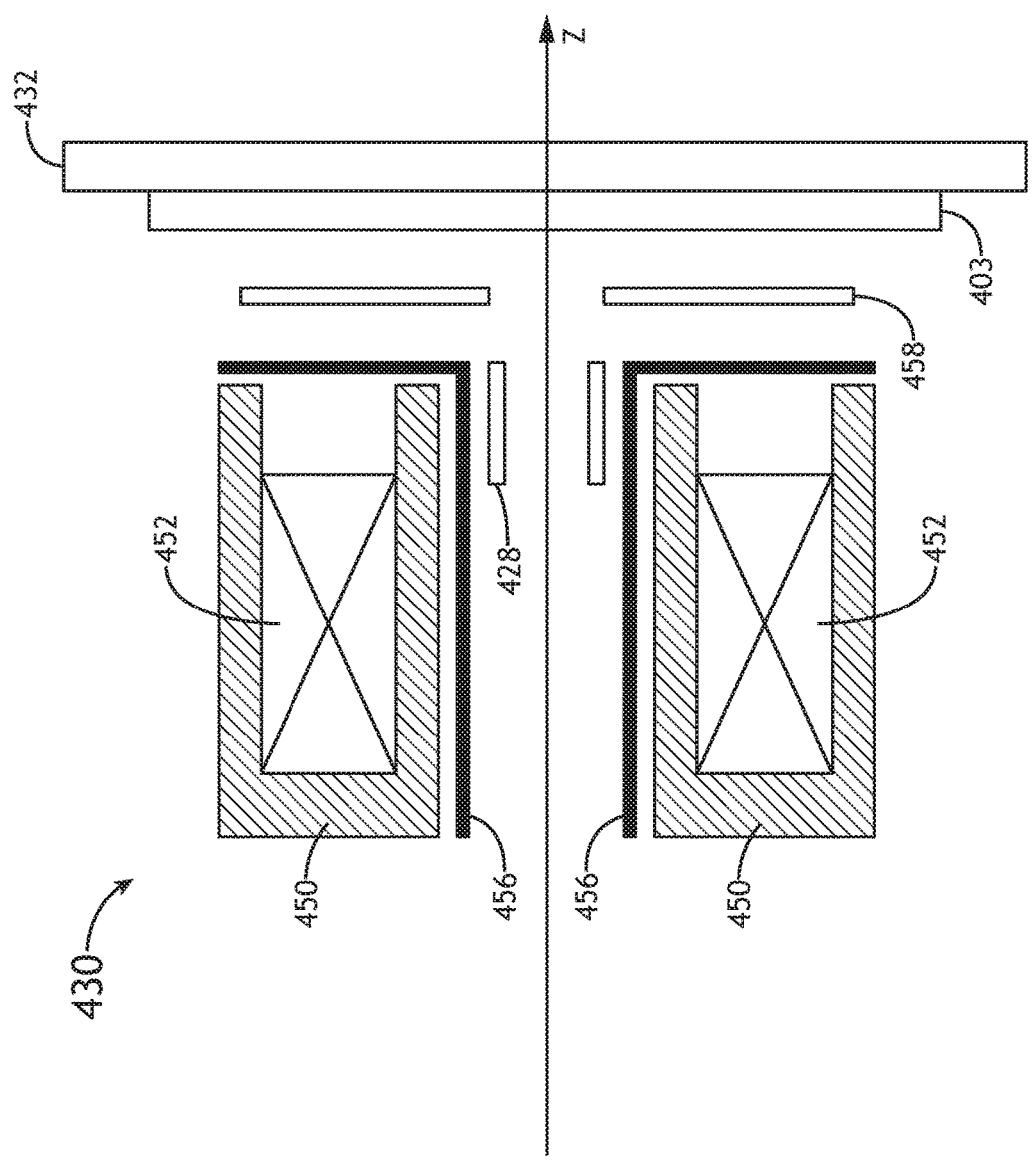
FIG. 6 illustrates a cross-sectional view of an objective lens of a scanning electron microscopy system, in accordance with one or more embodiments of the present disclosure.

FIG. 6 illustrates a cross-sectional view of objective lens 430 of a scanning electron microscopy system 400, in accordance with one or more embodiments of the present disclosure. In practice, the objective lens 430 may be rotationally symmetric about an optical axis, as shown in FIG. 6.

In embodiments, the objective lens 430 may include a jointly-used objective lens 430 which is used for flooding scans carried out in a flooding mode (FIG. 4A) and imaging scans carried out in an imaging mode (FIGS. 4B-4C). In embodiments, the objective lens 430 may include a magnetic focusing section including a pole piece 450 and a coil 452. The objective lens 430 may further include an electrostatic retarding/charging section including a ground tube 456 and a charge controlling plate (CCP) 458. As noted herein with respect to the double-lens assembly 414, the ground tube 454 may be configured to seal the pole piece 450 and coil 452 in air in order to protect the vacuum from contaminations.

It is noted herein that optimizing the beam limiting aperture 416 and double-lens assembly 412 in order to meet Equation 3 may enable significant inspection benefits over previous approaches. In particular, utilizing the scanning electron microscopy system 400 in accordance with Equation 3 may enable improved flood-charging speeds (e.g., shorter time requirements for flooding scans), as well as improved, high-resolution image forming characteristics for voltage contrast inspections across a wide range of beam currents. Attendant advantages of the scanning electron microscopy system 400 may be further understood with reference to FIG. 7.

Figure 7:
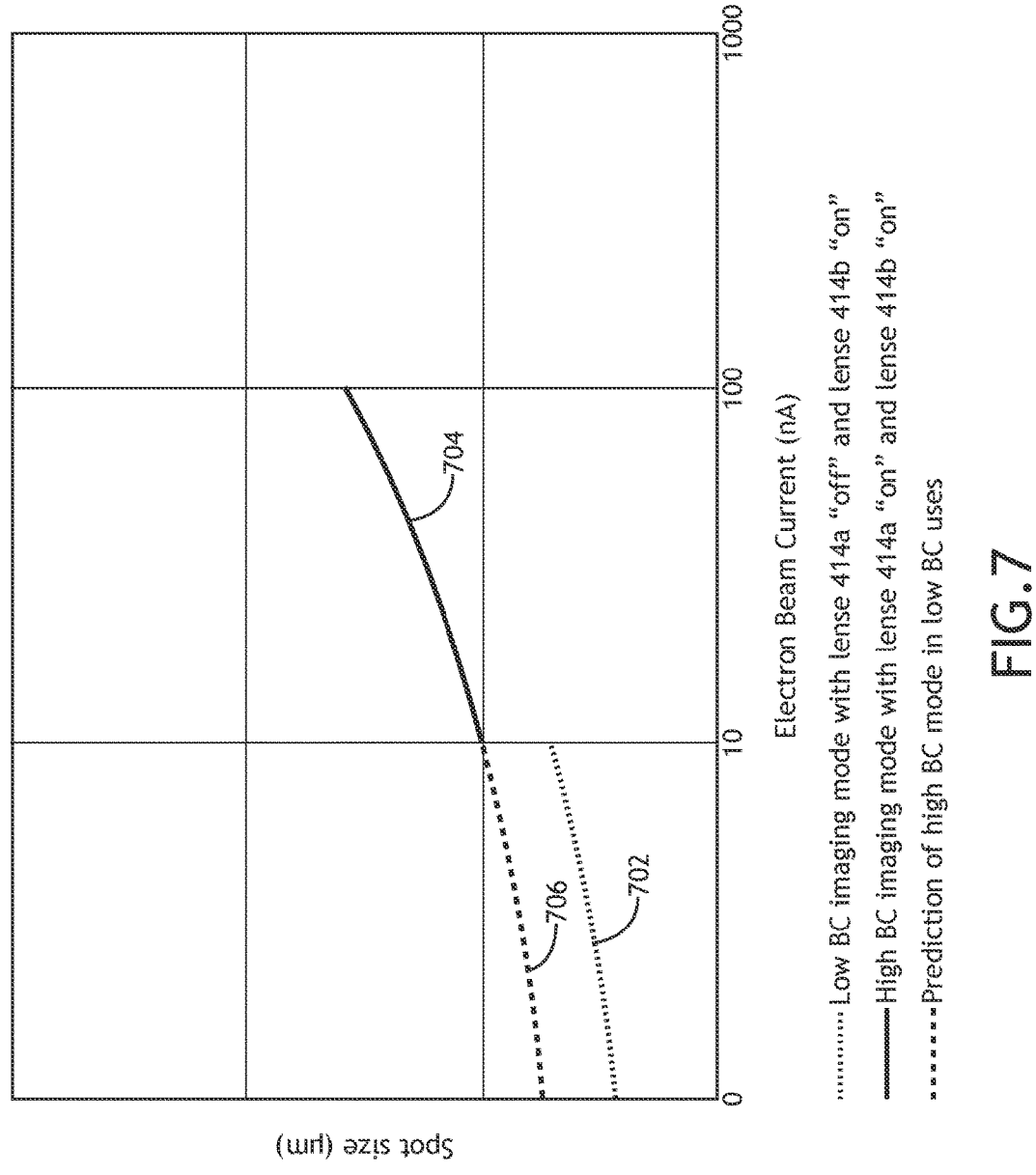
FIG. 7 is a graph illustrating a relationship between spot size and electron beam current, in accordance with one or more embodiments of the present disclosure.

FIG. 7 is a graph 700 illustrating a relationship between image-forming resolution and sample charging speed, in accordance with one or more embodiments of the present disclosure. As noted previously herein with respect to FIG. 3, electron beam current is directly related to charging speed, with higher electron beam currents resulting in faster charging speeds, and spot size is inversely related to image-forming resolution, with higher spot sizes resulting in lower image-forming resolution. Curve 702 illustrates low electron beam currents (e.g., $BC_{iL}$), curve 704 illustrates high electron beam currents (e.g., $BC_{iH}$), and curve 706 represents a prediction of high electron beam currents used for low electron beam applications.

As noted previously herein with respect to FIG.3, if one was to select a flooding electron beam current ($BC_f$) for a flooding scan (e.g., $BC_f$=1000 nA), very poor image-forming resolution would be achieved in low imaging electron beam currents ($BC_i$) for imaging scans (e.g., $BC_{iL}$=0-10 nA, $BC_{iH}$=0-100 nA). The poor image-forming resolution may be attributable to the heavy coulomb interaction effects of the electrons in between the beam limiting aperture 210 and the aperture 216. Comparatively, referring to FIG. 7, high resolutions for both 0-10 nA and 10-100 nA may be achieved with a raw low electron beam current (e.g., $BC_{iL}$=10 nA) and a raw high electron beam current (e.g., $BC_{iH}$=100 nA), separately, after having finished a flooding scan with an extremely high flooding electron beam current (e.g., $BC_f$=1000 nA).

Additional embodiments of the present disclosure are directed to techniques for performing flooding scans and/or imaging scans. This may be further understood with reference to FIGS. 8A-9.

Figure 8A:
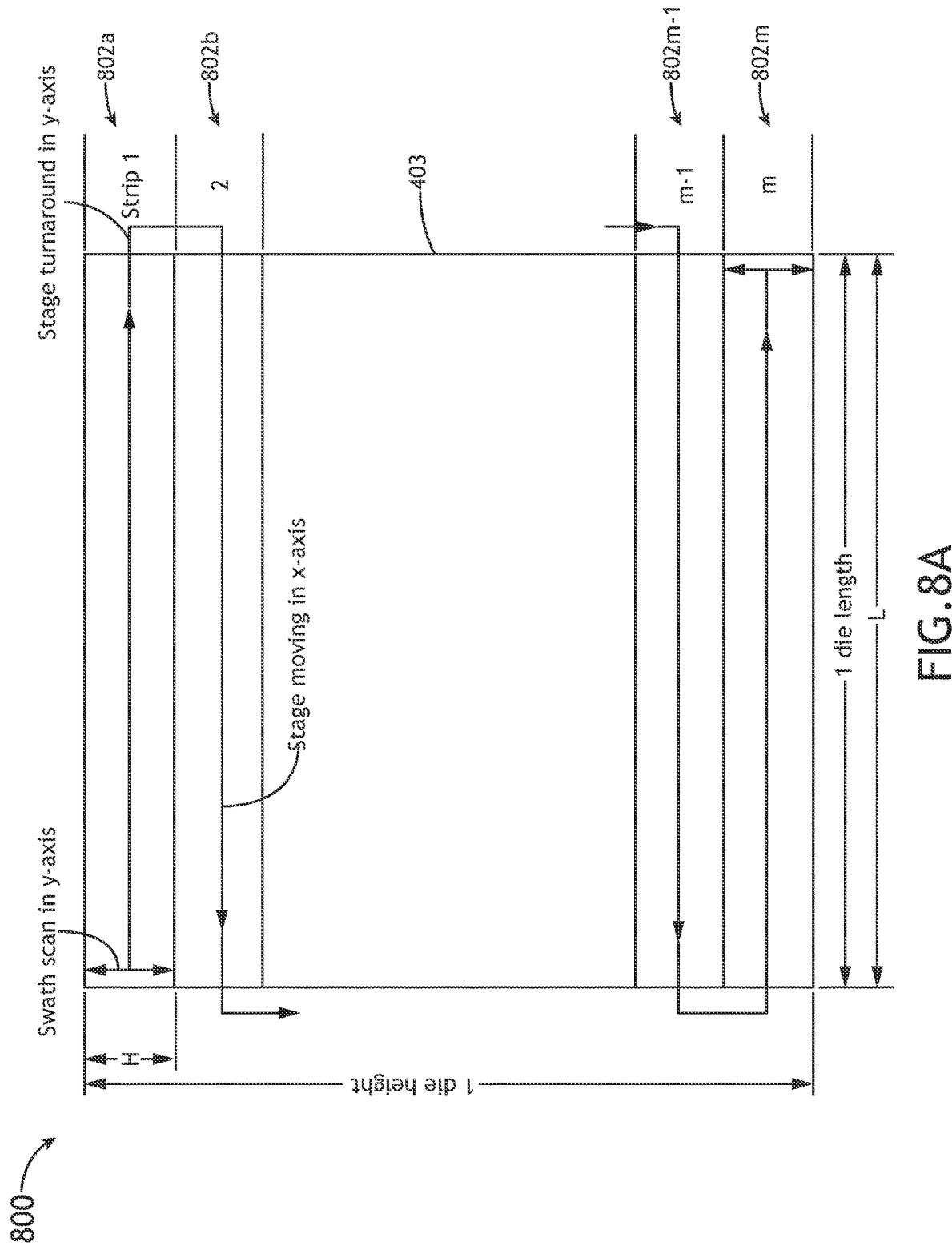
FIG. 8A illustrates a schematic view of a swathing scan procedure for performing voltage contrast inspections, in accordance with one or more embodiments of the present disclosure.
Figure 8B:
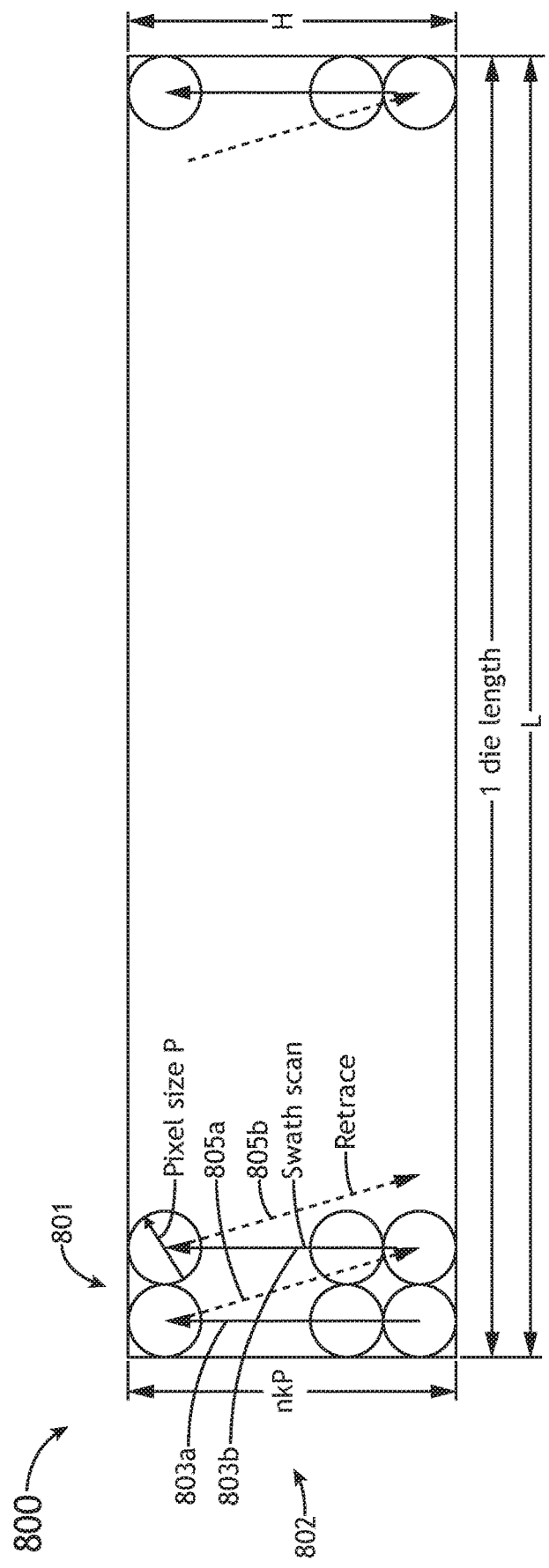
FIG. 8B illustrates a schematic view of a swathing scan procedure for performing voltage contrast inspections, in accordance with one or more embodiments of the present disclosure.

FIGS. 8A-8B illustrates a schematic view of a swathing scan procedure 800 for performing voltage contrast inspections, in accordance with one or more embodiments of the present disclosure. In some embodiments, the scanning electron microscopy system 400 may be configured to perform the swathing scan procedure 800 in order to carry out flooding scans in a flooding mode and/or imaging scans in an imaging mode.

One challenge in improving throughput for voltage contrast inspections of a sample 403 is visiting/scanning an imaging electron beam 401b within a large area approximately 10×10 mm (for instance, an area of a die in a patterned wafer) across at least a portion of a sample 403 which is significantly larger than 10×10 mm. Accordingly, embodiments of the present disclosure are directed to a swathing scan procedure 800 in order to improve throughputs for inspection, including voltage contrast inspections.

In embodiments, a controller 404 may be configured to carry out the swathing scan procedure 800 by logically dividing up a portion of a sample 403 (or portion of the sample 403 under inspection) into a plurality of lateral strips 802. For example, as shown in FIG. 8A, a sample 403 (or portion of sample 403 under inspection) may be divided up into a first lateral strip 802a, a second lateral strip 802b . . . , an $(m-1)^{th}$ lateral strip 802m-1, and an $m^{th}$ lateral strip 802m. One or more lateral strips of the plurality of lateral strips may be defined by a lateral length (L) and a swath-scan height (H). In embodiments, as shown in FIG. 8B, a swath-scan height (H) of a lateral strip 802 may be defined as H=nKP, wherein P defines the pixel spot size of the electron beam 401 (e.g., flooding electron beam 401a, imaging electron beam 401b) in nanometers (nm) to tens of nanometers (nm), K is the digital value 1024, and n is the "$k^{th}$" number.

In embodiments, the controller 404 may be configured to scan the electron beam 401 (e.g., flooding electron beam 401a, imaging electron beam 401b) along a vertical swath-scanning pattern 801 for the swath-scan height (H). After scanning the electron beam 401 along the vertical swath-scanning pattern 801 for the swath-scan height (H) in a first iteration 803a, the controller 404 may be configured to retrace the electron beam 401 in a first iteration 805a, then repeat scanning the electron beam 401 along the vertical swath-scanning pattern 801 for the swath-scan height (H). The controller 404 may be configured to scan the electron beam 401 along the vertical swath-scanning pattern 801 a plurality of iterations 803a-803n across the lateral strip 802 for the lateral length (L). In this regard, the vertical swath-scanning pattern 801 may be defined as a plurality of vertical scanning iterations 803a-803n combined with a plurality of retracing iterations 805a-805n-1.

In some embodiments, the controller 404 may be configured to actuate the electron beam 401 along the vertical swath-scanning pattern 801 for the swath-scan height (H) while simultaneously actuating the sample 403 (via the stage assembly 432). For example, the controller 404 may be configured to actuate the electron beam 401 along the vertical swath-scanning pattern 801 for the swath-scan height (H) while simultaneously actuating the sample 403 along a lateral direction parallel to the lateral length (L). The controller 404 may be configured to actuate the sample 403 at a constant speed by actuating the stage assembly 432 at a constant speed along the lateral direction parallel to the lateral length (L).

After one lateral strip 802 is finished, the sample 403 (e.g., stage assembly 432) may be turned around, and a subsequent lateral strip 802 may be scanned. For example, after scanning the electron beam 401 along the vertical swath-scanning pattern 801 across the first lateral strip 802a for the swath-scan height (H) and lateral length (L), the controller 404 may then be configured to perform the scan of the second lateral strip 802b with the same vertical swath-scanning pattern. For instance, as shown in FIG. 8A, the controller 404 may be configured to scan the electron beam 401 along the vertical swath-scanning pattern 801 across the first lateral strip 802a for the swath-scan height (H), while simultaneously actuating the sample 403 along a first lateral direction along the lateral length (L) of the first lateral strip 802. Upon completing the first lateral strip 802a, the controller 404 may be configured to scan the electron beam 401 along the vertical swath-scanning pattern 801 across the second lateral strip 802a for the swath-scan height (H), while simultaneously actuating the sample 403 along a second lateral direction opposite the first lateral direction along the lateral length (L) of the second lateral strip 802.

By way of another example, the controller 404 may be configured to scan the electron beam 401 along the vertical swath-scanning pattern 801 across the first lateral strip 802a for the swath-scan height (H), while simultaneously actuating the sample 403 along a first lateral direction along the lateral length (L) of the first lateral strip 802. Upon completing the first lateral strip 802a, the controller 404 may be configured to actuate the sample 403 along a second lateral direction opposite the first lateral direction along the lateral length (L), then repeat the vertical swath-scanning pattern 801 for the second lateral strip 802b.

In embodiments, throughput of the swathing scan procedure 800 carrying out an imaging scan for a sample 403 or a portion of the sample 403 may be defined as a function of the total time ($T_{img}$), which may be defined according to Equation 4:

$$T_{img} = \frac{L_d}{nkP} t_{st} + \frac{1}{nk} \left(\frac{L_d}{P}\right)^2 t_{rt} + \left(\frac{L_d}{P}\right)^2 t_{pd} \qquad (4)$$

wherein $L_d$ defines the height or length of a sample 403 under inspection (a sample 403 may be defined as area $L_d*L_d$), and $t_{st}$, $t_{rt}$, and $t_{pd}$ are the stage assembly 432 turn-around time, the scan retrace time, and the pixel dwell time, respectively. The pixel dwell time $t_{pd}$ may be given by pixel scan rates (in short, f), or $t_{pd}=1/f$. The pixel scan rate f may be further defined by signal (S) to noise (N) ratio (e.g., SNR) requirements during the flooding scans and/or imaging scans. The signal (S) may be defined as the imaging electron beam current ($BC_i$), whereas the noise (N) is typically considered as statistical shot noises. Accordingly, higher the imaging electron beam current ($BC_i$) enable higher scan rates to be used, thereby resulting in shorter pixel dwell time ($t_{pd}$) (e.g., increasing $BC_i$ decreases $t_{pd}$).

The throughput of the swathing scan procedure 800, as represented in Equation 4, may be improved/optimized according to the optical capabilities of pixel spot size (P) of the electron beam 401, imaging electron beam current ($BC_i$), and swath-scan height (H) (or the "$k^{th}$" number n). Throughput may also be improved/optimized according to the electronic capability of retrace time and mechanical capability of actuating the stage assembly 432 during the swathing scan procedure 800/vertical swath-scanning pattern 801.

It is noted herein that the swath-scan height (H) and/or the lateral length (L) used for the swathing scan procedure 800 may be set based on the design/capabilities of the dual-deflector assembly including the pre-scan deflectors 220 and the main scan deflectors 224. For example, the maximum scanning capabilities of the dual-deflector assembly may define the swath-scan height (H) and/or the lateral length (L). However, it is further noted herein that increasing swath-scan height (H) and/or the lateral length (L) may increase throughput, but result in increased off-axis blurs and distortion.

In addition to using the swathing scan procedure 800 for carrying out imaging scans, the swathing scan procedure 800 may additionally and/or alternatively be used for carrying out flooding scans. The swathing scan procedure 800 may also be significantly simplified for flooding scans. In particular, the pixel size for a flooding electron beam 401a may be as large as hundreds of microns (μm), as compared to the pixel size for an imaging electron beam 401b which may be on the order of nanometers (nm) to hundreds of nanometers (nm). Accordingly, when utilizing the swathing scan procedure 800 for flooding scans, the pixel spot size (P) may be set to be as large as the swath-scan height (H) for each lateral strip 802. In this regard, scanning a flooding electron beam 401a along the vertical swath-scanning pattern 801 may be unnecessary for flooding scans due to the increased size of the flooding electron beam 401a. As noted previously herein, the larger pixel spot size of the flooding electron beam 401a may be achieved by selectively controlling focusing strengths of the condenser lens 422 and/or the objective lens 430.

In embodiments, throughput of the swathing scan procedure 800 carrying out a flooding scan (flood-charging) may be defined as a function of the total time ($T_{chrg}$), which may be defined according to Equation 5:

$$T_{chrg} = \frac{L_d}{H} t_{st} + \frac{L_d^2}{vH} \qquad (5)$$

wherein H defines the pixel spot size of the flooding electron beam 401a, and v defines the speed of the stage assembly 432. Due to the increased pixel spot size, the total flood-charging time ($T_{chrg}$) may be negligible in comparison to the total imaging time ($T_{img}$). The difference between $T_{img}$ and $T_{chrg}$ may be dependent on the pixel size of the imaging electron beam 401b used for the imaging scans. For example, $T_{chrg} \ll 0.1*T_{img}$ for large pixel spot sizes of the imaging electron beam 401b, and $T_{chrg} \ll 0.01*T_{img}$ for small pixel spot sizes of the imaging electron beam 401b.

In some embodiments, the flood-charging voltage (e.g., induced surface voltages of the sample 403) may be a function of position (e.g., $V_{FC}(x, y)$), and may be defined according to Equation 6:

$$V_{FC}(x, y) = \left(\frac{BC_f}{\varepsilon_0 vH}\right) * \frac{d(x, y)}{\varepsilon_r(x, y)} \qquad (6)$$

wherein $BC_f$ defines the flooding electron beam current, $\varepsilon_0$ defines vacuum permittivity, $\varepsilon_r(x, y)$ defines the relative vacuum permittivity in the local position (x, y), and d(x, y) defines the layer thickness of the sample 403 in local position (x, y). For a requirement of an induced voltage contrast of 1-10V (e.g., $V_{FC}$=1-10V), Equation 6 may be used to design the optics of the electron-optical sub-system 402 used to carry out the flooding scan.

In this regard, when carrying out a flooding scan intended to achieve a specified voltage contrast ($V_{FC}$) of the sample 403, the controller 404 may set the flooding electron beam current ($BC_f$), pixel size of the flooding electron beam (H), and the speed of the stage assembly 432 according to Equation 6. Generally speaking, induced charging voltages of a layer are sufficient (e.g., $V_{FC}$>10V) with the fastest moving speed of the stage assembly 432 (e.g., v=100-200 mm/s), together flooding electron beam currents in the order of with sub-μA (e.g., $BC_f$=sub-μA) and a pixel size of the flooding electron beam 401a in the order of hundreds of microns (μm).

Figure 9:
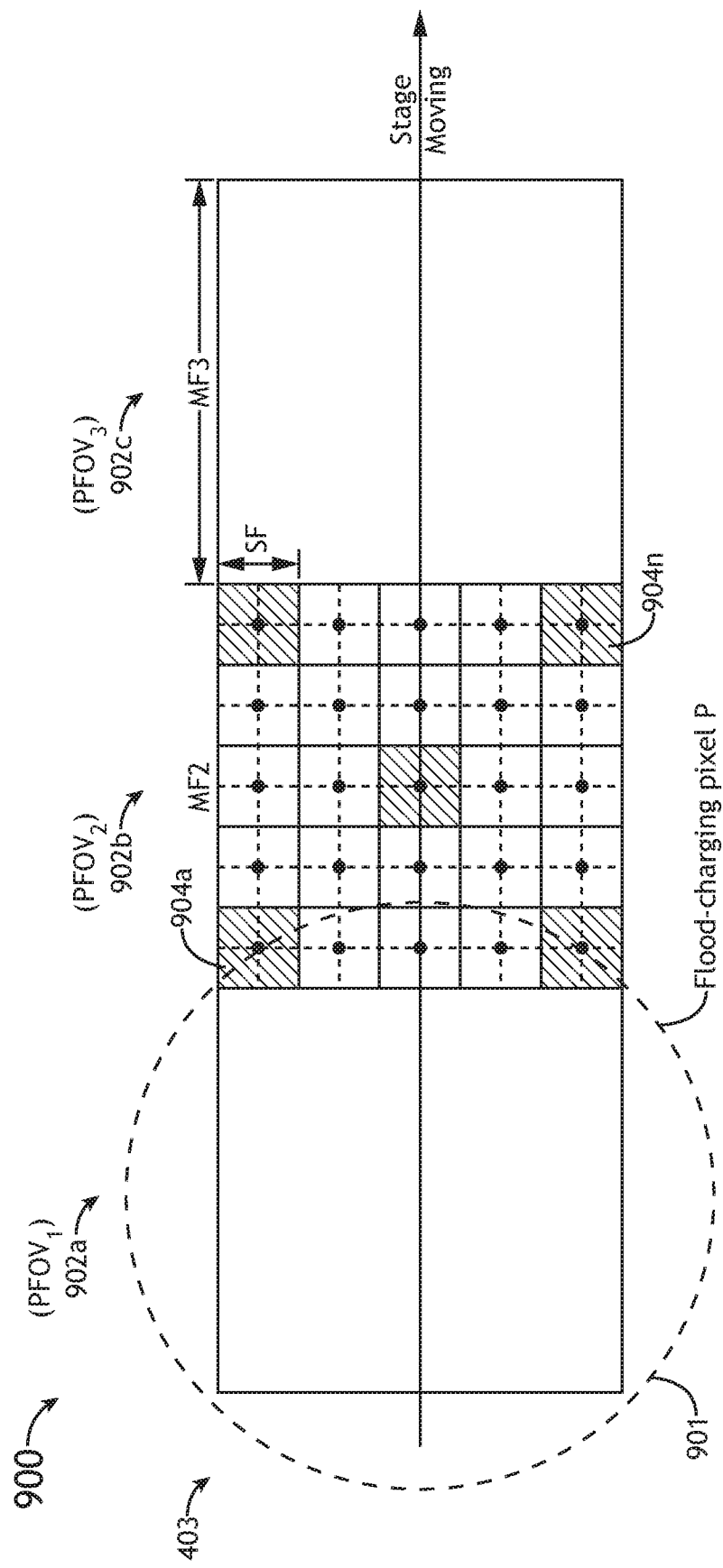
FIG. 9 illustrates a schematic view of stepwise procedure for performing voltage contrast inspections, in accordance with one or more embodiments of the present disclosure.

FIG. 9 illustrates a schematic view of stepwise procedure 900 for performing voltage contrast inspections, in accordance with one or more embodiments of the present disclosure.

In additional and/or alternative embodiments, the scanning electron microscopy system 400 may be configured to perform the stepwise procedure 900 in order to carry out flooding scans in a flooding mode and/or imaging scans in an imaging mode. The stepwise procedure 900 may sometimes be referred to as a "step and scan" procedure 900.

In embodiments, the controller 404 may be configured to carry out the stepwise procedure 900 by logically dividing up the sample 403 (or portion of the sample 403 under inspection) into a plurality of primary fields of view (PFOV 902). For example, as shown in FIG. 9, the controller 404 may be configured to divide up a portion of the sample 403 under inspection into a first PFOV 902a (PFOV1), a second PFOV 902b (PFOV2), and a third PFOV 902c (PFOV3). In embodiments, a PFOV 902 may be sized on the order of tens of microns (μm) to hundreds of microns (μm). The size of each PFOV 902 may be determined relative to the flooding pixel spot size 901 of the flooding electron beam 401a. For example, as shown in FIG. 9, the PFOVs 902 may be sized such that they are smaller than the flooding pixel spot size 901. However, this is not to be regarded as a limitation of the present disclosure, unless noted otherwise herein.

In another embodiment, the controller 404 may be configured to sub-divide up the PFOVs 902 into a plurality of sub-fields of view (SFOV 904). For example, as shown in FIG. 9, the controller 404 may be configured to divide up the PFOV 902b into a plurality of SFOVs 904a-904n. The plurality of SFOVs 904a-904n may be arranged in any configuration known in the art including, but not limited to, an m×n array.

In embodiments, the controller 404 may be configured to perform one or more flooding scans and one or more imaging scans of each respective PFOV 902 before moving on to the next PFOV 902. For example, the controller 404 may be configured to perform one or more flooding scans of the first PFOV 902a with a flooding electron beam 401a while in a flooding mode. Subsequently, the controller 404 may be configured to switch the electron-optical sub-system 402 into an imaging mode, and perform one or more imaging scans of the first PFOV 902a by scanning the imaging electron beam 401b across the plurality of SFOVs 904a-904b. In some embodiments, the controller 404 may be configured to scanning the imaging electron beam 401b across the plurality of SFOVs 904a-904b. along a raster-scanning pattern. The sample 403 and stage assembly 434 may remain stationary while scanning the imaging electron beam across the plurality of SFOVs 904a-904b within a single PFOV 902.

After performing the flooding and imaging scans of the first PFOV 902a, the controller 404 may be configured to switch the electron-optical sub-system 402 back into a flooding mode. The controller 404 may be further configured to selectively actuate the sample 403 in order to align the second PFOV 902b with the optical axis of the electron-optical sub-system 402. Subsequently, the controller 404 may be configured to perform one or more flooding scans of the second PFOV 904b, switch the electron-optical sub-system 402 back into an imaging mode, and perform one or more imaging scans of second PFOV 902b by scanning the imaging electron beam 401b across the plurality of SFOVs 904a-904n of the second PFOV 902b. This flooding-imaging process may be continued for each PFOV 902a-902n until the entire sample 403 (or portion of the sample 403) has been inspected.

The total flood-charging time for a single PFOV ($T_{PFOV}$) may be defined and/or estimated according to Equation 7:

$$T_{PFOV} = \pi\varepsilon_0\varepsilon_r \frac{P^2 V_{FC}}{4dBC_f} \quad (7)$$

wherein P defines the flooding pixel spot size 901 of the flooding electron beam 401a, $V_{FC}$ defines the desired induced voltage contrast, d defines the thickness of a local layer of the sample 403 within the PFOV, and $BC_f$ defines the flooding electron beam current.

In embodiments where the flooding pixel spot size 901 (P) is large enough to cover an entire PFOV 902 (as shown in FIG. 9), the total flood-charging time for a single PFOV ($T_{PFOV}$) may be on the order of sub-milliseconds. For example, consider flood-charging to achieve an induced voltage contrast of 10V ($V_{FC}$=10V) of a PFOV 902 which is 100 μm in size (e.g., less than flooding pixel spot size 901) where the insulator layer is 1 μm thick (d=1 μm) with a flooding electron beam current of 100 nA ($BC_f$=100 nA). In this example, according to Equation 7, the total flood-charging time for a single PFOV ($T_{PFOV}$) may be on the order of sub-milliseconds. Accordingly, $T_{PFOV}$ may be negligible compared to the stage assembly 434 stepping time, which is typically on the order of sub-seconds.

It is noted herein that there may be some instances in which the flooding pixel spot size 901 (P) is not large enough to cover an entire PFOV 902. For example, magnetic speeds of magnetic components within the electron-optical sub-system 402 may make it difficult to produce a flooding pixel spot size 901 (P) which is sufficiently large to cover an entire PFOV 902. However, even where the flooding pixel spot size 901 (P) is not large enough to cover an entire PFOV 902, the flooding pixel spot size 901 (P) would likely still be relatively large in comparison to the PFOV 902, and would require minimal scanning to cover the entire PFOV 902. Accordingly, a sub-millisecond flood-charging time ($T_{PFOV}$) may still be achieved by scanning the relatively large flooding pixel spot size 901 (P) over the PFOV 902 using the dual-deflector assembly (e.g., pre-scan deflectors 220 and main scan deflectors 224). It is noted herein that a flooding pixel spot size 901 (P) on the order of microns may be achieved by defocusing the condenser lens 422 while maintaining constant excitations of the objective lens 430.

It is contemplated herein that embodiments of the present disclosure may cure one or more shortfalls of previous used for voltage contrast inspection systems. For example, by using a joint electron-optical column to carry out both flooding scans and imaging scans, the scanning electron microscopy system 400 of the present disclosure may reduce the size, weight, and complexity of the system. Additionally, by selectively adjusting characteristics of the electron-optical sub-system 402 (e.g., double-lens assembly 412, beam limiting aperture 416, aperture 420, and the like), the scanning electron microscopy system 400 of the present disclosure may enable rapid flood-charging speeds, while maintaining high image-forming resolution. In particular, the scanning electron microscopy system 400 of the present disclosure may reduce residual electron currents between the beam limiting aperture 416 and the aperture 420, thereby reducing Coulomb interaction effects between residual electrons and improving image-forming resolution during imaging scans.

It is noted herein that the one or more components of the disclosed scanning electron microscopy system 400 may be communicatively coupled to the various other components of the system in any manner known in the art. For example, the controller 404, electron-optical sub-system 402 (e.g., electron source 410, beam limiting aperture 416, objective lens 430), detector assembly 434, and the like, may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth, 3G, 4G, 4G LTE, 5G, and the like).

In another embodiment, scanning electron microscopy system 400 may include a controller 404. In one embodiment, controller 404 includes one or more processors 406 and memory 408. In another embodiment, the one or more processors 406 may be configured to execute a set of program instructions stored in memory 408, wherein the set of program instructions are configured to cause the one or more processors 406 to carry out the steps of the present disclosure.

In one embodiment, the one or more processors 406 may include any one or more processing elements known in the art. In this sense, the one or more processors 406 may include any microprocessor-type device configured to execute software algorithms and/or instructions. In one embodiment, the one or more processors 406 may consist of a desktop computer, mainframe computer system, workstation, image computer, parallel processor, or other computer system (e.g., networked computer) configured to execute a program configured to operate the scanning electron microscopy system 400, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from memory 408. Moreover, different subsystems of the scanning electron microscopy system 400 (e.g., controller 404, electron source 410, detector assembly 434) may include processor or logic elements suitable for carrying out at least a portion of the steps described throughout the present disclosure. Therefore, the above description should not be interpreted as a limitation on the present disclosure but merely an illustration.

The memory 408 may include any storage medium known in the art suitable for storing program instructions executable by the associated one or more processors 406 and images generated by the scanning electron microscopy system 400. For example, the memory 408 may include a non-transitory memory medium. For instance, the memory 408 may include, but is not limited to, a read-only memory (ROM), a random-access memory (RAM), a magnetic or optical memory device (e.g., disk), a magnetic tape, a solid-state drive and the like. It is further noted that memory 408 may be housed in a common controller housing with the one or more processors 406. In an alternative embodiment, the memory 408 may be located remotely with respect to the physical location of the processors 406, controller 404, and the like. In another embodiment, the memory 408 maintains program instructions for causing the one or more processors 406 to carry out the various steps described through the present disclosure.

In one embodiment, a user interface 436 is communicatively coupled to the controller 404. In one embodiment, the user interface 436 may include, but is not limited to, one or more desktops, tablets, smartphones, smart watches, or the like. In another embodiment, the user interface 436 includes a display used to display data of the scanning electron microscopy system 400 to a user. The display of the user interface 436 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 436 is suitable for implementation in the present disclosure. In another embodiment, a user may input selections and/or instructions responsive to data displayed to the user via the user interface 436. For example, a user may be able to input one or more control commands, via the user interface 436, in order to switch the scanning electron microscopy system 400 between a flooding mode and an imaging mode.

Figure 10:
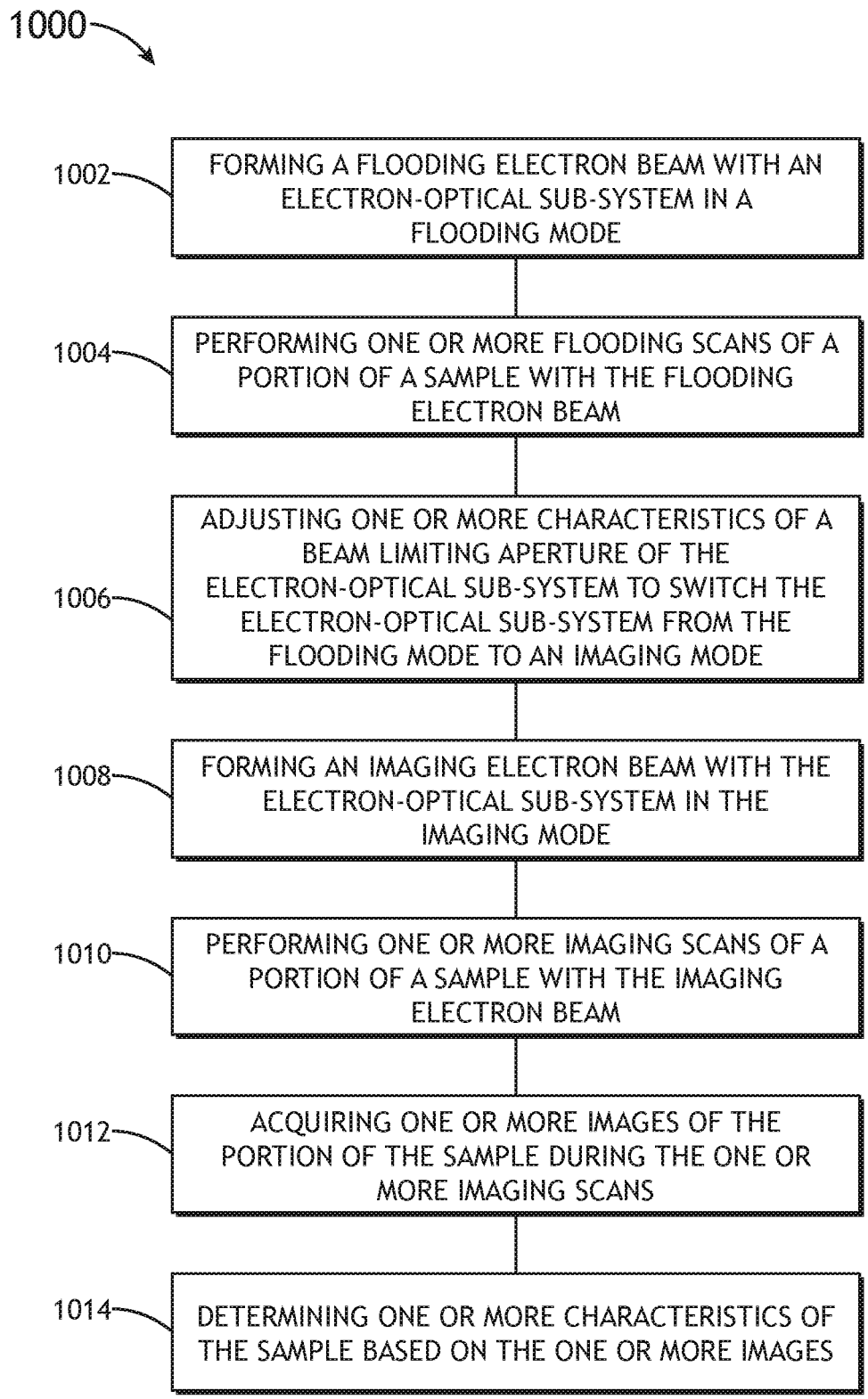
FIG. 10 illustrates a flowchart of a method for performing voltage contrast inspections, in accordance with one or more embodiments of the present disclosure.

FIG. 10 illustrates a flowchart of a method 1000 for performing voltage contrast inspections, in accordance with one or more embodiments of the present disclosure. It is noted herein that the steps of method 1000 may be implemented all or in part by the scanning electron microscopy system 400. It is further recognized, however, that the method 1000 is not limited to the scanning electron microscopy system 400 in that additional or alternative system-level embodiments may carry out all or part of the steps of method 1000.

In a step 1002, a flooding electron beam is formed with an electron-optical sub-system in a flooding mode. For example, FIG. 4A illustrates a scanning electron microscopy system 400 in a flooding mode. As shown in FIG. 4A, the controller 404 may be configured to cause an electron source 410 of the electron-optical sub-system 402 to generate a flooding electron beam 401a.

In a step 1004, one or more flooding scans of a portion of a sample are performed with the flooding electron beam. The one or more flooding scans may be performed on the sample 403 in order to induce a voltage contrast within one or more layers of the sample 403. For example, upon generating the flooding electron beam 401a, the flooding electron beam 401a may be scanned across the surface of the sample 403 via the pre-scan deflectors 424 and/or main scan deflectors 428. In additional and/or alternative embodiments, the controller 404 may be configured to carry out the one or more flooding scans by scanning the flooding electron beam 401a by selectively actuating the stage assembly 432 upon which the sample 403 is disposed.

In a step 1006, one or more characteristics of a beam limiting aperture of the electron-optical sub-system are adjusted to switch the electron-optical sub-system from the flooding mode to an imaging mode. For example, the controller 404 may be configured to switch the electron-optical sub-system 402 between the flooding mode and the imaging mode by selectively adjusting a size of the beam limiting aperture 416 and/or a position of the beam limiting aperture 416 within the double-lens assembly 412 (e.g., distance from first lens 414a, distance from second lens 414b).

In a step 1008, an imaging electron beam is formed with the electron-optical sub-system in the imaging mode. For example, FIGS. 4B-4C illustrate a scanning electron microscopy system 400 in an imaging mode. As shown in FIGS. 4B-4C, the controller 404 may be configured to cause an electron source 410 of the electron-optical sub-system 402 to generate an imaging electron beam 401b.

In a step 1010, one or more imaging scans of a portion of a sample are performed with the imaging electron beam. For example, upon generating the imaging electron beam 401b, the imaging electron beam 401b may be scanned across the surface of the sample 403 via the pre-scan deflectors 424 and/or main scan deflectors 428. In additional and/or alternative embodiments, the controller 404 may be configured to carry out the one or more imaging scans by scanning the imaging electron beam 401b by selectively actuating the stage assembly 432 upon which the sample 403 is disposed.

In a step 1012, one or more images of the portion of the sample are acquired during the one or more imaging scans. For example, the detector assembly 432 may be configured to generate one or more images of the sample 403 based on the collected/received secondary electrons 411. In another embodiment, the controller 404 may receive the one or more images acquired by the detector assembly 434 during the one or more imaging scans, and store the received images in memory 408.

In a step 1014, one or more characteristics of the sample are determined based on the one or more images. Characteristics of the sample 403 which may be identified may include, but are not limited to, the presence of defects (e.g., catastrophic defects, nuisance defects), defect position, defect size, measurements of the sample 403, and the like.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," "temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A scanning electron microscopy system, comprising:
a joint electron-optical sub-system comprising:
an electron source configured to generate an electron beam;
a joint electron-optical column configured to direct the electron beam to a sample, the joint electron-optical column comprising:
a joint double-lens assembly including a first lens and a second lens, wherein the first lens is configured to focus the electron beam to a first electron beam crossover;
a joint beam limiting aperture disposed between the first lens and the second lens of the double-lens assembly, wherein the second lens is configured to focus the electron beam to a second electron beam crossover, wherein the electron beam focused by the second lens is the same beam as focused by the first lens; and
a joint detector assembly configured to detect electrons scattered from a surface of the sample; and
a controller communicatively coupled to the joint electron-optical sub-system, the controller including one or more processors configured to execute a set of program instructions stored in a memory, the program instructions configured to cause the one or more processors to:
generate one or more control signals configured to cause the joint electron-optical sub-system to form a flooding electron beam and perform one or more flooding scans of a portion of the sample with the flooding electron beam, wherein the flooding electron beam is configured to induce a voltage contrast in one or more layers of the portion of the sample;
generate one or more control signals configured to cause the joint electron-optical sub-system to form an imaging electron beam and perform one or more voltage contrast imaging scans of the portion of the sample with the imaging electron beam;
receive one or more voltage contrast images acquired by the joint detector assembly during the one or more imaging scans; and
identify one or more surface-level defects and one or more sub-surface defects from the one or more voltage contrast images, wherein the one or more sub-surface defects are characterized by voltage contrast information from the surface of the one or more layers of the sample.

2. The system of claim 1, wherein the flooding electron beam includes a flooding electron beam current ($BC_f$) and a flooding emission angle ($\beta_f$), and wherein the imaging electron beam includes an imaging electron beam current ($BC_i$) and an imaging emission angle ($\beta_i$), and
wherein the flooding electron beam current ($BC_f$) is greater than the imaging electron beam current ($BC_i$).

3. The system of claim 2, wherein the flooding electron beam current ($BC_f$) is at least ten times greater than the imaging electron beam current ($BC_i$).

4. The system of claim 2, wherein the flooding emission angle ($\beta_f$) is greater than the imaging electron beam emission angle ($\beta_i$).

5. The system of claim 1,
wherein the one or more flooding scans are performed in a flooding mode and the one or more imaging scans are performed in an imaging mode,
wherein the one or more processors are configured to switch the electron-optical sub-system between the flooding mode and the imaging mode by selectively adjusting one or more characteristics of the beam limiting aperture.

6. The system of claim 5, wherein the one or more characteristics of the beam limiting aperture comprise at least one of a size of the beam limiting aperture, or a position of the beam limiting aperture between the first lens and the second lens.

7. The system of claim 5, wherein the electron-optical sub-system further comprises a Wien filter configured to direct electrons emanating from the sample to the detector assembly, wherein the controller is configured to operate the Wien filter at a constant strength in the flooding mode and the imaging mode.

8. The system of claim 1, wherein both the flooding electron beam and the imaging electron beam are directed from the electron source to the sample by the electron-optical column.

9. The system of claim 1, wherein the electron-optical sub-system further comprises an aperture, wherein the double-lens assembly is configured to receive the electron beam from the electron source, and direct the electron beam to the aperture.

10. The system of claim 9, wherein the controller is further configured to selectively adjust one or more characteristics of the aperture in order to adjust the imaging electron beam current ($BC_i$).

11. The system of claim 1, wherein the double-lens assembly comprises a first gun lens and a second gun lens.

12. The system of claim 1, wherein the double-lens assembly comprises a gun lens and an electrostatic lens.

13. The system of claim 1, wherein the one or more electron-optical elements comprise a beam limiting aperture disposed between the first lens and the second lens of the double-lens assembly.

14. The system of claim 13, wherein the controller is further configured to generate one or more control signals configured to selectively adjust one or more characteristics of the beam limiting aperture in order to select a maximum electron beam current directed through the electron-optical column.

15. The system of claim 1, wherein the electron source comprises at least one of a thermal field emission (TFE) electron source or a cold-field emission (CFE) electron source.

16. The system of claim 1, wherein performing at least one of the one or more flooding scans or the one or more imaging scans comprises:
dividing the portion of the sample into one or more lateral strips, the one or more lateral strips including a lateral length (L) and a swath-scan height (H); and
scanning at least one of the flooding electron beam or the imaging electron beam along a vertical swath-scanning pattern for the swath-scan height (H) a plurality of iterations for the lateral length (L).

17. The system of claim 16, wherein performing at least one of the one or more flooding scans or the one or more imaging scans comprises:
dividing the portion of the sample into a first lateral strip and at least one additional lateral strip, the first lateral strip and the least one additional lateral strip including a lateral length (L) and a swath-scan height (H);
scanning at least one of the flooding electron beam or the imaging electron beam along a vertical swath-scanning pattern across the first lateral strip for the swath-scan height (H) while simultaneously actuating the portion of the sample along a first lateral direction along the lateral length (L) of the first lateral strip; and
scanning at least one of the flooding electron beam or the imaging electron beam along a vertical swath-scanning pattern across the at least one additional lateral strip for the swath-scan height (H) while simultaneously actuating the portion of the sample along a second lateral direction opposite the first lateral direction along the lateral length (L) of the at least one additional lateral strip.

18. The system of claim 1, wherein performing at least one of the one or more flooding scans or the one or more imaging scans comprises:
dividing the portion of the sample into a first primary field of view (PFOV) and at least one additional primary field of view (PFOV);
performing the one or more flooding scans of the first PFOV;
performing the one or more imaging scans of the first PFOV by scanning the imaging electron beam along a raster-scanning pattern across a plurality of sub-fields of view (SFOV) of the first PFOV;
selectively actuating the sample;
performing the one or more flooding scans of the at least one additional PFOV;
performing the one or more imaging scans of the at least one additional PFOV by scanning the imaging electron beam along a raster-scanning pattern across a plurality of sub-fields of view (SFOV) of the at least one additional PFOV.

19. The system of claim 18, wherein a size of at least one of the first PFOV or the at least one additional PFOV is less than a spot size of the flooding electron beam.

20. The system of claim 1, wherein the controller is further configured to:
generate one or more control signals configured to selectively adjust one or more characteristics of one or more process tools based on the one or more determined characteristics.

21. A scanning electron microscopy system, comprising:
a controller communicatively coupled to a joint electron-optical sub-system, the controller including one or more processors configured to execute a set of program instructions stored in a memory, the program instructions configured to cause the one or more processors to:
generate one or more control signals configured to cause the joint electron-optical sub-system to form a flooding electron beam in a flooding mode, and perform one or more flooding scans of a portion of the sample with the flooding electron beam, wherein the flooding electron beam is configured to induce a voltage contrast in one or more layers of the portion of the sample;
generate one or more control signals configured to selectively adjust one or more characteristics of a beam limiting aperture of the joint electron-optical sub-system in order to switch the joint electron-optical sub-system from the flooding mode to an imaging mode, wherein the beam limiting aperture is disposed between a first lens and a second lens of a joint double-lens assembly, wherein the first lens is configured to focus the electron beam to a first electron beam crossover, wherein the second lens is configured to focus the electron beam to a second electron beam crossover, wherein the electron beam focused by the second lens is the same beam as focused by the first lens;
generate one or more control signals configured to cause the joint electron-optical sub-system to form an imaging electron beam in the imaging mode, and perform one or more voltage contrast imaging scans of a portion of the sample with the imaging electron beam;
receive one or more voltage contrast images acquired by a joint detector assembly of the joint electron-optical sub-system during the one or more imaging scans; and
identify one or more surface-level defects and one or more sub-surface defects from the one or more voltage contrast images, wherein the one or more sub-surface defects are characterized by voltage contrast information from the surface of the one or more layers of the sample.

22. A method, comprising:
forming a flooding electron beam with a joint electron-optical sub-system in a flooding mode;
performing one or more flooding scans of a portion of a sample with the flooding electron beam;
adjusting one or more characteristics of a beam limiting aperture of the joint electron-optical sub-system to switch the joint electron-optical sub-system from the flooding mode to an imaging mode;
forming an imaging electron beam with the joint electron-optical sub-system in the imaging mode, wherein the joint electron-optical subsystem includes a joint double-lens assembly including a first lens, a second lens, and a joint beam limiting aperture disposed between the first lens and the second lens, wherein the first lens is configured to focus the electron beam to a first electron beam crossover, wherein the second lens is configured to focus the electron beam to a second electron beam crossover, wherein the electron beam focused by the second lens is the same beam as focused by the first lens;

performing one or more voltage contrast imaging scans of a portion of a sample with the imaging electron beam;

acquiring one or more voltage contrast images of the portion of the sample during the one or more imaging scans; and identifying one or more surface-level defects and one or more sub-surface defects from the one or more voltage contrast images, wherein the one or more sub-surface defects are characterized by voltage contrast information from the surface of the one or more layers of the sample.

23. The method of claim 22, wherein the flooding electron beam includes a flooding electron beam current ($BC_f$) and a flooding emission angle ($\beta_f$), and wherein the imaging electron beam includes an imaging electron beam current ($BC_i$) and an imaging emission angle ($\beta_i$), and wherein the flooding electron beam current ($BC_f$) is greater than the imaging electron beam current ($BC_i$).

24. The method of claim 23, wherein the flooding electron beam current ($BC_f$) is at least ten times greater than the imaging electron beam current ($BC_i$), and wherein the flooding emission angle ($\beta_f$) is greater than the imaging electron beam emission angle ($\beta_i$).

25. The method of claim 22, wherein the one or more characteristics of the beam limiting aperture comprise at least one of a size of the beam limiting aperture, or a position of the beam limiting aperture between a first lens and a second lens of a double-lens assembly.

26. The method of claim 22, wherein performing the one or more imaging scans comprises:

dividing the portion of the sample into one or more lateral strips, the one or more lateral strips including a lateral length (L) and a swath-scan height (H); and scanning the imaging electron beam along a vertical swath-scanning pattern for the swath-scan height (H) a plurality of iterations for the lateral length (L).

27. The method of claim 22, wherein the one or more imaging scans comprises:

dividing the portion of the sample into a first lateral strip and at least one additional lateral strip, the first lateral strip and the least one additional lateral strip including a lateral length (L) and a swath-scan height (H);

scanning the imaging electron beam along a vertical swath-scanning pattern across the first lateral strip for the swath-scan height (H) while simultaneously actuating the portion of the sample along a first lateral direction along the lateral length (L) of the first lateral strip; and scanning the imaging electron beam along a vertical swath-scanning pattern across the at least one additional lateral strip for the swath-scan height (H) while simultaneously actuating the portion of the sample along a second lateral direction opposite the first lateral direction along the lateral length (L) of the at least one additional lateral strip.

28. The method of claim 22, wherein the one or more imaging scans comprises:

dividing the portion of the sample into a first primary field of view (PFOV) and at least one additional primary field of view (PFOV);

performing the one or more flooding scans of the first PFOV;

performing the one or more imaging scans of the first PFOV by scanning the imaging electron beam along a raster-scanning pattern across a plurality of sub-fields of view (SFOV) of the first PFOV;

selectively actuating the sample;

performing the one or more flooding scans of the at least one additional PFOV;

performing the one or more imaging scans of the at least one additional PFOV by scanning the imaging electron beam along a raster-scanning pattern across a plurality of sub-fields of view (SFOV) of the at least one additional PFOV.

* * * * *